(12) United States Patent
Rofougaran

(10) Patent No.: US 7,974,587 B2
(45) Date of Patent: Jul. 5, 2011

(54) LOCAL WIRELESS COMMUNICATIONS WITHIN A DEVICE

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1145 days.

(21) Appl. No.: 11/648,744

(22) Filed: Dec. 30, 2006

(65) Prior Publication Data

US 2008/0159243 A1    Jul. 3, 2008

(51) Int. Cl.
H04B 1/40 (2006.01)

(52) U.S. Cl. .......... 455/84; 455/90.1; 455/79; 257/723; 235/492

(58) Field of Classification Search .............. 455/84, 455/90.1, 79; 257/723, 924; 235/492, 380
See application file for complete search history.

(56) References Cited

U.S. PATENT DOCUMENTS

| | | | |
|---|---|---|---|
| 6,175,287 B1 | 1/2001 | Lampen | |
| 6,263,193 B1 * | 7/2001 | Iseki et al. | 455/84 |
| 6,542,720 B1 * | 4/2003 | Tandy | 455/90.3 |
| 6,856,788 B2 * | 2/2005 | Chang et al. | 455/41.1 |
| 6,942,157 B2 * | 9/2005 | Nozawa et al. | 235/492 |
| 7,330,702 B2 * | 2/2008 | Chen et al. | 455/73 |
| 7,590,397 B2 * | 9/2009 | Kondo et al. | 455/161.2 |
| 7,617,342 B2 * | 11/2009 | Rofougaran | 710/100 |
| 2002/0145566 A1 * | 10/2002 | Ballantine et al. | 343/700 MS |
| 2005/0075080 A1 | 4/2005 | Zhang | |

FOREIGN PATENT DOCUMENTS

| | | |
|---|---|---|
| WO | 02091616 A | 11/2002 |
| WO | 02091616 A2 | 11/2002 |

* cited by examiner

*Primary Examiner* — Yuwen Pan
(74) *Attorney, Agent, or Firm* — Garlick Harrison & Markison; Holly L. Rudnick

(57) ABSTRACT

A radio transceiver device includes circuitry for radiating electromagnetic signals at a very high radio frequency both through space, as well as through wave guides that are formed within a substrate material. In one embodiment, the substrate comprises a dielectric substrate formed within a board, for example, a printed circuit board. In another embodiment of the invention, the wave guide is formed within a die of an integrated circuit radio transceiver. A plurality of transceivers with different functionality is defined. Substrate transceivers are operable to transmit through the wave guides, while local transceivers are operable to produce very short range wireless transmissions through space. A third and final transceiver is a typical wireless transceiver for communication with remote (non-local to the device) transceivers.

26 Claims, 26 Drawing Sheets substrate 150

| transceiver ID | transceiver ID | assigned subcarrier | frequency modulation type |
|---|---|---|---|
| A | B | $f_1$ | 128 QAM |
| A | C | $f_2$ | 128 QAM |
| B | C | $f_3$ | 64 QAM |
| B | D | $f_4$ | 64 QAM |
| D | E | $f_5$ | 64 QAM |
| B | E | $f_6$ | 64 QAM |
| C | E | $f_1$ | 64 QAM |
| E | F | $f_8$ | 64 QAM |
| C | F | $f_7$ | 64 QAM |
| F | G | $f_2$ | 64 QAM |
| G | D | $f_8$ | 8 QAM |
| H | remote device | $f_{12}$ | QPSK |
| substrate $_M$ | substrate $_N$ | $f_{10}$ | 256 QAM |
| substrate $_M$ | substrate $_O$ | $f_{11}$ | 256 QAM |

FIG. 16

LOCAL WIRELESS COMMUNICATIONS WITHIN A DEVICE

BACKGROUND

1. Technical Field

The present invention relates to wireless communications and, more particularly, to circuitry for wireless communications.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

As integrated circuit die decrease in size while the number of circuit components increases, chip layout becomes increasingly difficult and challenging. Amongst other known problems, there is increasingly greater demand for output pins to a die even though the die size is decreasing. Similarly, within the die itself, the challenge of developing internal buses and traces to support high data rate communications becomes very challenging. A need exists, therefore, for solutions that support the high data rate communications and reduce the need for pin-outs and for circuit traces within the bare die. Moreover, advancements in communication between ICs collocated within a common device or upon a common printed circuit board is needed to adequately support the forth-coming improvements in IC fabrication. Therefore, a need exists for an integrated circuit antenna structure and wireless communication applications thereof.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 16 is a table illustrating an example of assignment static or permanent assignment of carrier frequencies to specified communications between intra-device local transceivers, substrate transceivers, and other transceivers within a specified device;

DETAILED DESCRIPTION OF THE DRAWINGS

Figure 1:
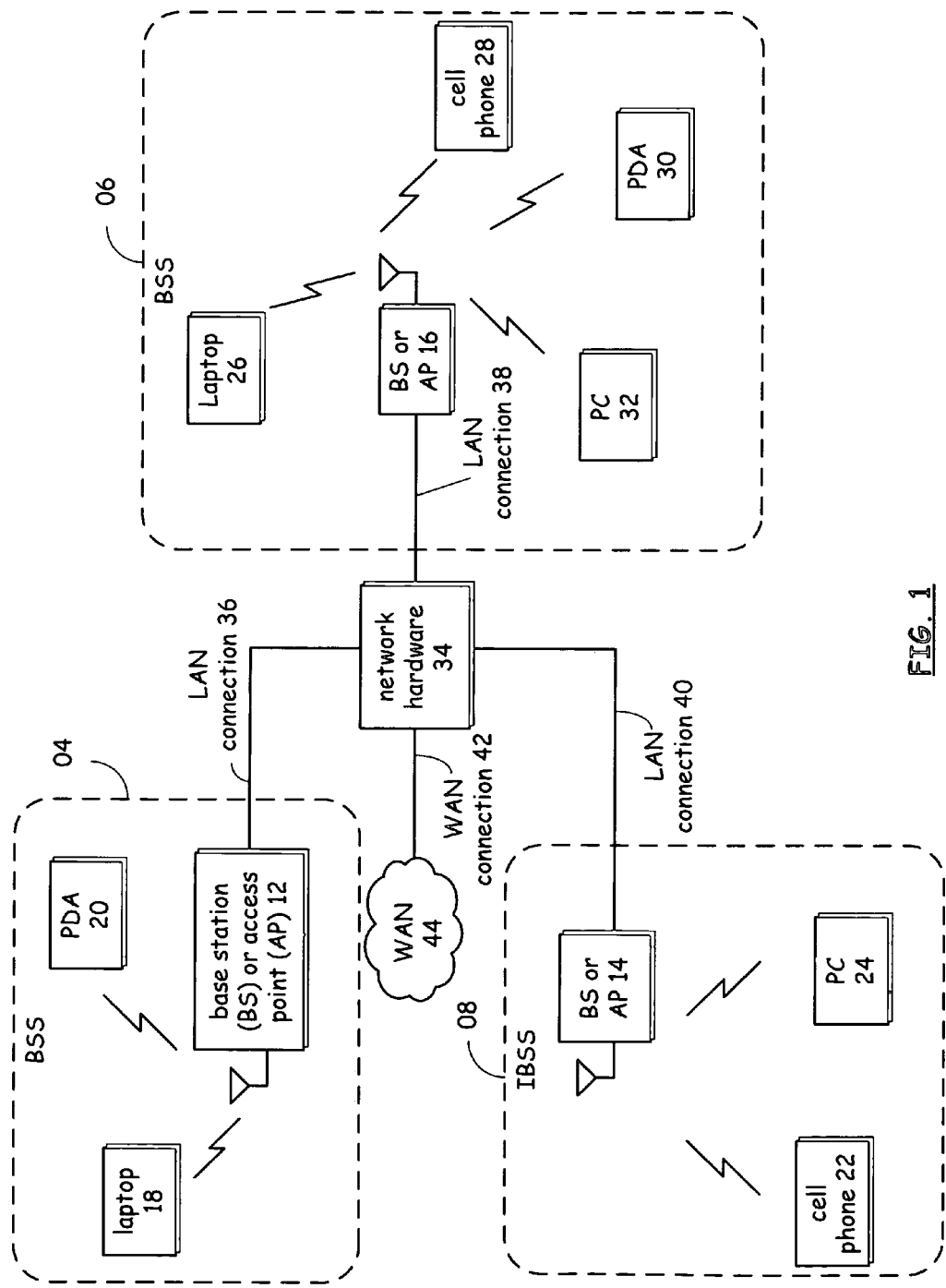
FIG. 1 is a schematic block diagram illustrating a wireless communication device that includes a host device and an associated radio.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. For purposes of the present specification, each wireless communication device of FIG. 1 including host devices 18-32, and base stations or APs 12-16, includes at least one associated radio transceiver for wireless communications with at least one other remote transceiver of a wireless communication device as exemplified in FIG. 1. More generally, a reference to a remote communication or a remote transceiver refers to a communication or transceiver that is external to a specified device or transceiver. As such, each device and communication made in reference to Figure one is a remote device or communication. The embodiments of the invention include devices that have a plurality of transceivers operable to communicate with each other. Such transceivers and communications are referenced here in this specification as local transceivers and communications.

Figure 2:
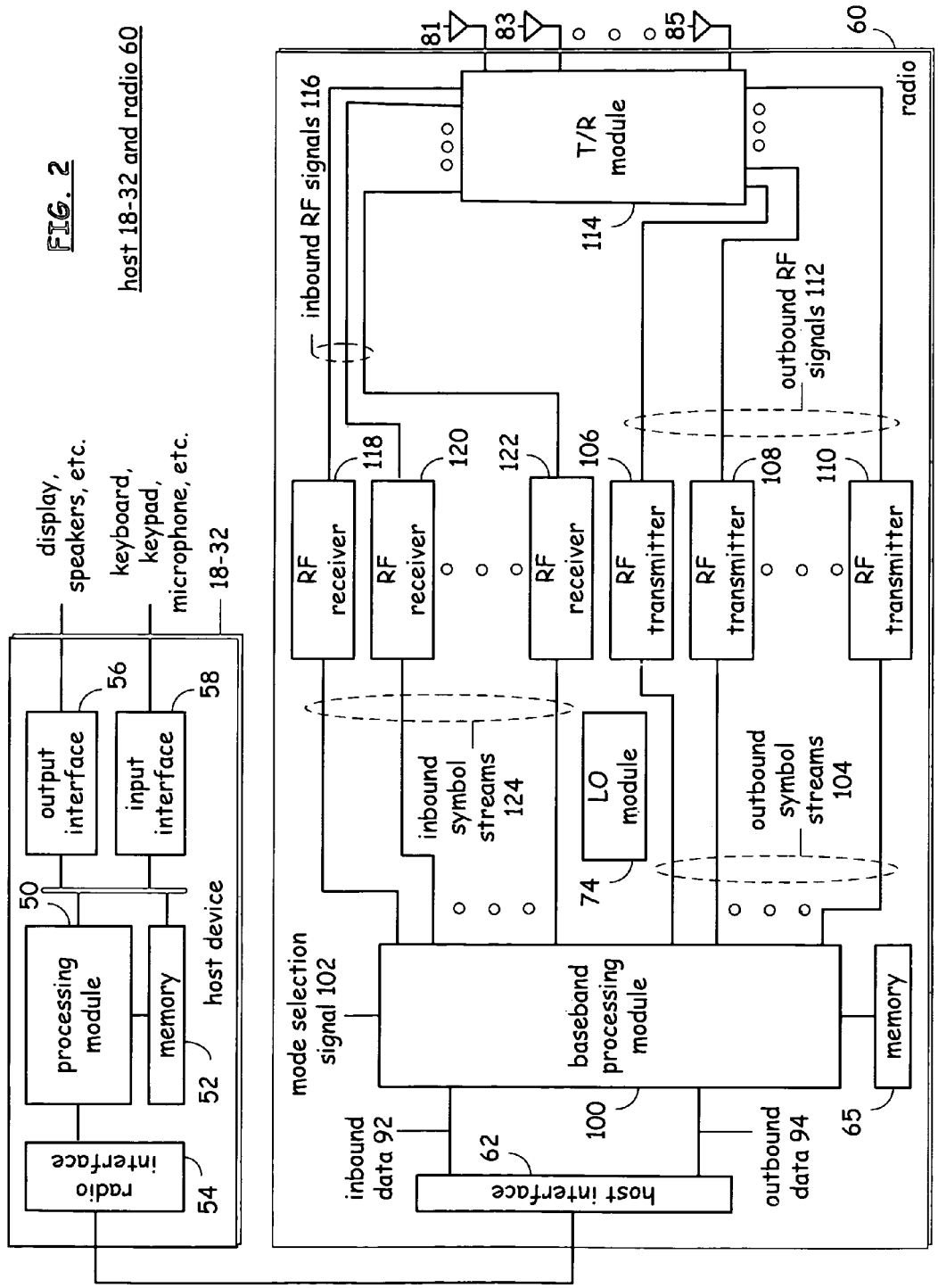
FIG. 2 is a schematic block diagram illustrating a wireless communication device that includes a host device and an associated radio.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 2 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

FIG. 2 generally illustrates a MIMO transceiver and is useful to understanding the fundamental blocks of a common transceiver. It should be understood that any connection shown in FIG. 2 may be implemented as a physical trace or as a wireless communication link. Such wireless communication links are supported by local transceivers (not shown in FIG. 2) that are operable to transmit through space or through an electromagnetic wave guide formed within a substrate of a printed circuit board housing the various die that comprise the MIMO transceiver or within a substrate of a die (e.g., a dielectric substrate). Illustrations of circuitry and substrate structures to support such operations are described in greater detail in the Figures that follow.

It is generally known that an inverse relationship exists between frequency and signal wavelength. Because antennas for radiating radio frequency signals are a function of a signal wavelength, increasing frequencies result in decreasing wavelengths which therefore result in decreasing antenna lengths to support such communications. In future generations of radio frequency transceivers, the carrier frequency will exceed or be equal to at least 10 GHz, thereby requiring a relatively small monopole antenna or dipole antenna. A monopole antenna will typically be equal to a size that is equal to a one-half wavelength, while a dipole antenna will be equal to a one-quarter wavelength in size. At 60 GHz, for example, a full wavelength is 5 millimeters, thus a monopole antenna size will be approximately equal to 2.5 millimeters and dipole antenna size will be approximately equal to 1.25 millimeters. With such a small size, the antenna may be implemented on the printed circuit board of the package and/or on the die itself. As such, the embodiments of the invention include utilizing such high frequency RF signals to allow the incorporation of such small antenna either on a die or on a printed circuit board.

Printed circuit boards and die often have different layers. With respect to printed circuit boards, the different layers have different thickness and different metallization. Within the layers, dielectric areas may be created for use as electromagnetic wave guides for high frequency RF signals. Use of such wave guides provides an added benefit that the signal is isolated from outside of the printed circuit board. Further, transmission power requirements are reduced since the radio frequency signals are conducted through the dielectric in the wave guide and not through air. Thus, the embodiments of the present invention include very high frequency RF circuitry, for example, 60 GHz RF circuitry, which are mounted either on the printed circuit board or on the die to facilitate corresponding communications.

Figure 3:
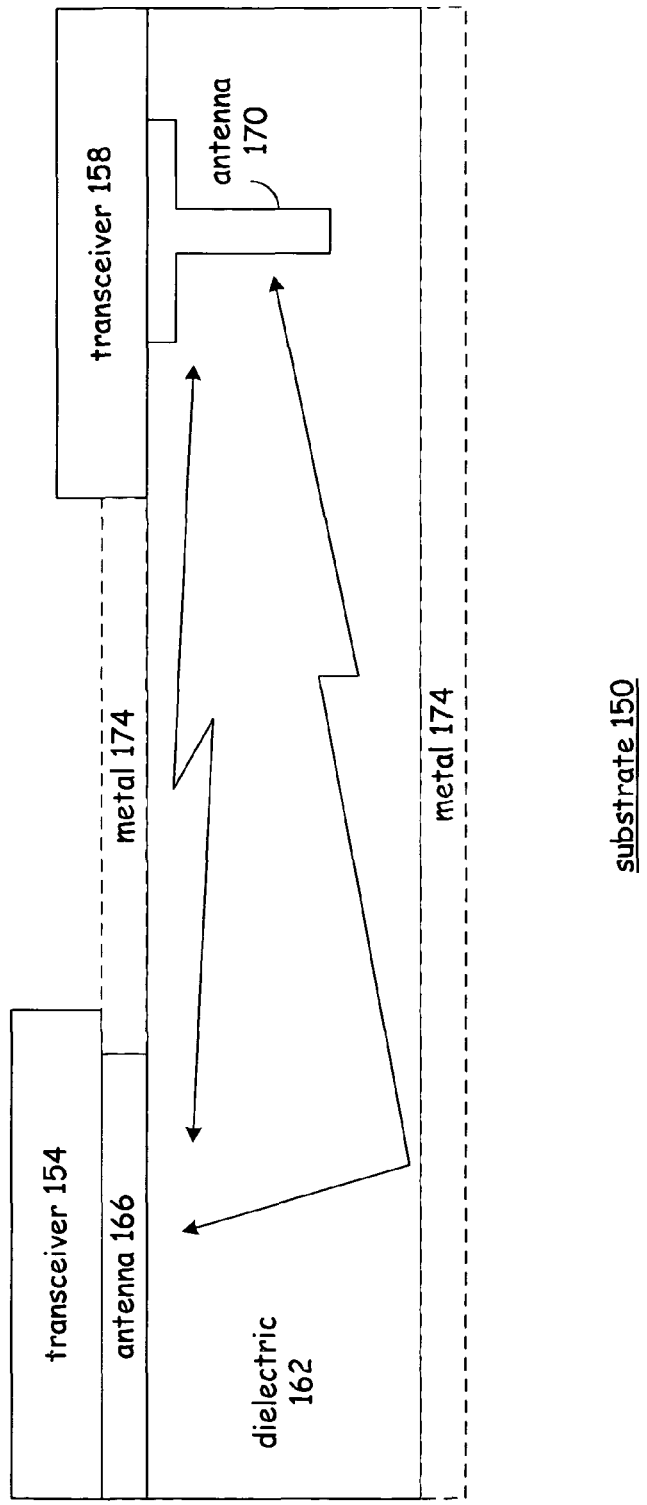
FIG. 3 is a functional block diagram of a substrate configured according to one embodiment of the invention.

FIG. 3 is a functional block diagram of a substrate configured according to one embodiment of the invention that includes a dielectric substrate operable as an electromagnetic wave guide according to one embodiment of the present invention. Referring to FIG. 3, it may be seen that a substrate 150 includes a transceiver 154 that is operably disposed to communicate with a transceiver 158. References herein to substrates generally refer to any supporting substrate and specifically include printed circuit boards and other boards that support integrated circuits and other circuitry. References to substrate also include semiconductor substrates that are part of integrated circuits and die that support circuit elements and blocks. Thus, unless specifically limited herein this specification to a particular application, the term substrate should be understood to include all such applications with their varying circuit blocks and elements. Thus, with reference to substrate 150 of FIG. 3, the substrate 150 may be a printed circuit board wherein the transceivers may be separate integrated circuits or die operably disposed thereon. Alternatively, substrate 150 may be a integrated circuit wherein the transceivers are transceiver modules that are a part of the integrated circuit die circuitry.

In the described embodiment of the invention, transceiver 154 is communicatively coupled to antenna 166, while transceiver 158 is communicatively coupled to antenna 170. The first and second substrate antennas 166 and 170, respectively, are operably disposed to transmit and receive radio frequency communication signals through the substrate region 162 which, in the described embodiment, is a dielectric substrate region. As may be seen, antenna 166 is operably disposed upon a top surface of dielectric substrate 162, while antenna 170 is operably disposed to penetrate into dielectric substrate 162. Each of these antenna configurations exemplifies different embodiments for substrate antennas that are for radiating and receiving radio frequency signals transmitted through dielectric substrate 162. As may further be seen from examining FIG. 3, an optional metal layer 174 may be disposed upon either or both of a top surface and a bottom surface of dielectric substrate 162. Metal layers 174 are operable to further isolate and shield the electromagnetic waves transmitted through dielectric substrate 162 as high frequency RF. The use of such metal layers 174 is especially applicable to embodiments of the invention in which the substrate comprises a printed circuit board but can include any structure having a deposited metal layer thereon.

In operation, transceiver 154 is a very high frequency transceiver that generates electromagnetic signals having a frequency that is greater than or equal to 10 GHz. In one specific embodiment of the invention, the electromagnetic signals are characterized by a 60 GHz (+/−5 GHz) radio frequency. One corresponding factor to using such high frequency electromagnetic signals is that short antenna lengths may be utilized that are sized small enough to be placed on or within a substrate whether that substrate is a printed circuit board or a bare die. Thus, transceiver 154 is operable to radiate through dielectric substrate 162 through antenna 166 for reception by antenna 170 for substrate transceiver 158. These transceivers are specifically named substrate transceivers herein to refer to transceivers that have been designed to communicate through a dielectric substrate, such as that shown in FIG. 3.

It should be noted that dielectric substrate 162 is defined by a bound volume, regardless of whether metal layers 174 are included, and is the equivalent of an electromagnetic wave guide and shall be referenced herein as such. In general terms, it is expected that dielectric substrate 162 will have a reasonably uniform fabrication to reduce interference within the dielectric substrate 162. For example, metal components, or other components within the dielectric substrate, will tend to create multi-path interference and/or absorb the electromagnetic signals thereby reducing the effectiveness of the transmission. With a reasonably uniform or consistent dielectric substrate, however, low power signal transmissions may be utilized for such short range communications.

Figure 4:
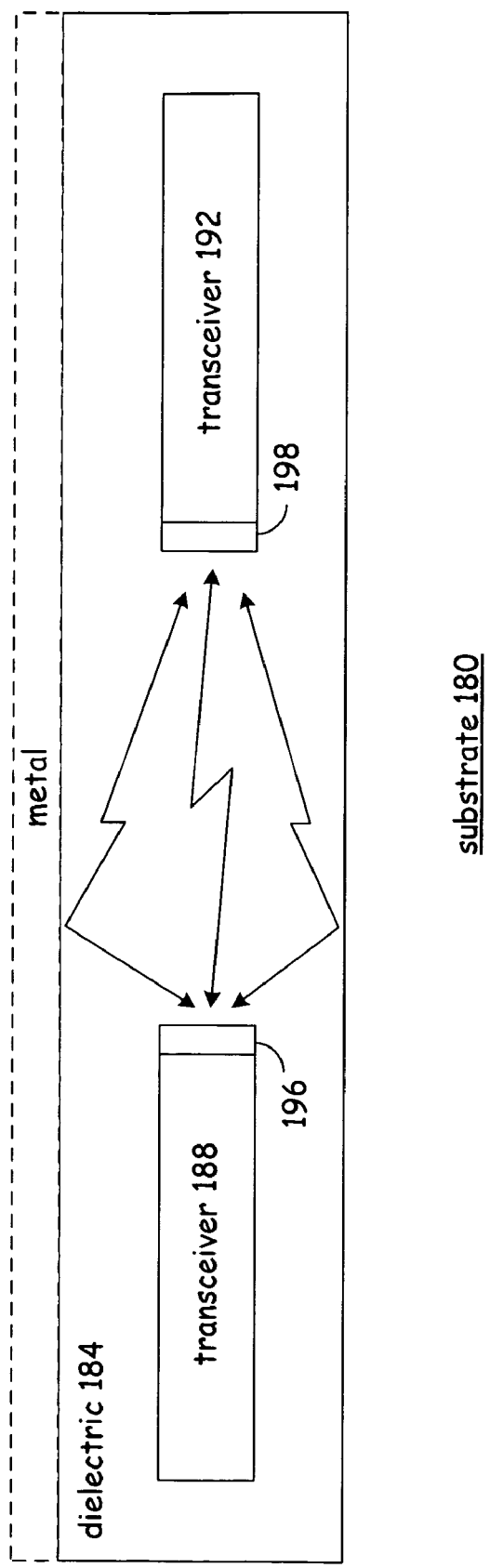
FIG. 4 is a functional block diagram of an alternate embodiment of a substrate that includes a plurality of embedded substrate transceivers.

FIG. 4 is a functional block diagram of an alternate embodiment of a substrate that includes a plurality of embedded substrate transceivers. As may be seen, a substrate 180 includes a dielectric substrate region 184 that includes embedded substrate transceivers 188 and 192 that are operable to communicate with each other. As may be seen, substrate transceiver 188 includes a substrate antenna 196, while substrate transceiver 192 includes a second substrate antenna 198.

Substrate transceivers 188 and 192 are operably disposed within the dielectric substrate 184, as is each of their antennas 196 and 198, respectively, and are operable to transmit the very high frequency electromagnetic signals through the wave guide, which is formed by dielectric substrate 184. As described in relation to FIG. 3, a metal layer is optional but not required.

Generally, while the metal layer is not required either on the top or bottom layer of the substrate, the metal is helpful to isolate the electromagnetic signals contained within the wave guide to reduce interference of those signals with external circuitry or the signals from external circuitry to interfere with the electromagnetic signals transmitted through the wave guide. The boundary of the dielectric substrate reflects the radio frequency of electromagnetic signals to keep the signals within the dielectric substrate 184 and therefore minimize interference with external circuitry and devices on top of or within the dielectric. The substrate antennas are sized and placed to radiate only through the dielectric substrate 184.

Figure 5:
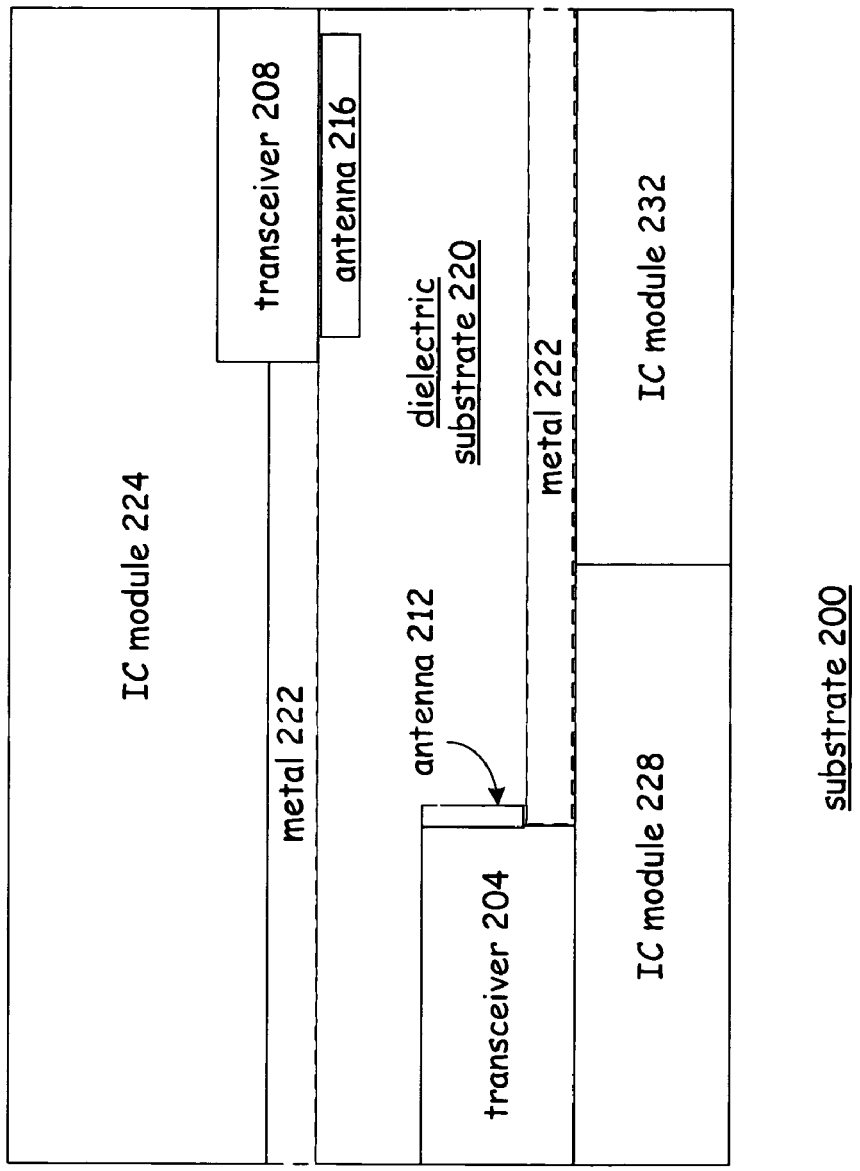
FIG. 5 is a functional block diagram of a substrate that includes a plurality of embedded substrate transceivers surrounded by integrated circuit modules and circuitry according to one embodiment of the present invention.

FIG. 5 is a functional block diagram of a substrate that includes a plurality of substrate transceivers surrounded by integrated circuit modules and circuitry according to one embodiment of the present invention. As may be seen, a substrate 200 includes an embedded substrate transceiver 204 that is operable to communicate with a substrate transceiver 208 by way of substrate antennas 212 and 216, respectively.

While transceiver 204 is embedded in the dielectric substrate 220, transceiver 208 is operably disposed on a surface of dielectric substrate 220.

The electromagnetic signals are transmitted from transceivers 204 and 208 through the substrate antennas 212 and 216 to radiate through a dielectric substrate 220. In the embodiment shown, dielectric substrate 220 is bounded by metal layers 222 which further shield the electromagnetic signals transmitted through the wave guide that is formed by dielectric substrate 220. The dielectric substrate 220 is surrounded, as may be seen, by IC modules 224, 228 and 232. In the specific embodiment of substrate 200, one typical application would be a printed circuit board in which the dielectric substrate is formed within the printed circuit board which is then layered with metal layer 222 and operably supports ICs 224, 228 and 232. The metal layer 222 not only is operable as a shield, but may also be used to conduct signals in support of IC modules 224, 228 and 232. For exemplary purposes, transceiver 208 is operable to support communications for IC module 224 while transceiver 204 is operable to support communications for IC module 228.

Figure 6:
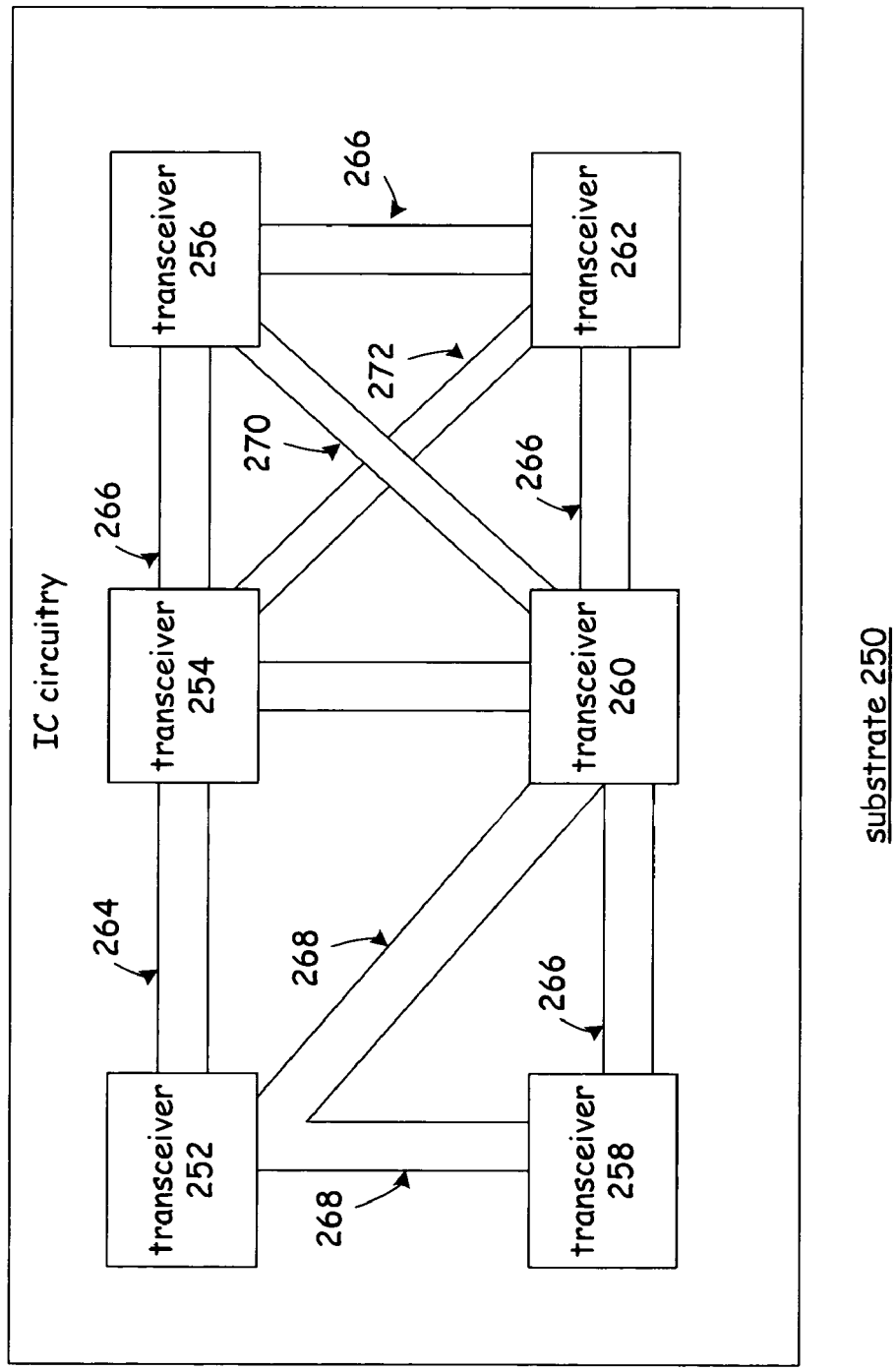
FIG. 6 is a functional block diagram of a substrate that includes a plurality of transceivers operably disposed to communicate through wave guides formed within the substrate according to one embodiment of the present invention.

FIG. 6 is a functional block diagram of a substrate that includes a plurality of transceivers operably disposed to communicate through wave guides formed within the substrate according to one embodiment of the present invention. As may be seen, a substrate 250 includes a plurality of transceivers 252, 254, 256, 258, 260, and 262. Each transceiver 252-262 has associated circuitry not shown here and can be operably disposed within the dielectric or on top of the dielectric with an associated antenna protruding into the dielectric. As may be seen, the substrate 250 includes a plurality of wave guides formed within for conducting specific communications between specified transceivers. For example, a wave guide 264 is operably disposed to support communications between transceivers 252 and 254. Similarly, wave guides 266 support communications between transceivers 254, 256, 262, 260, and 258, as shown.

Some other noteworthy configurations may also be noticed. For example, a wave guide 268 supports transmissions from transceiver 252 to transceivers 258 and 260. Alternatively, each of the transceivers 258 and 260 may transmit only to transmitter 252 through wave guide 268 because of the shape of wave guide 268. An additional configuration according to one embodiment of the invention, may be seen with wave guides 270 and 272. As may be seen, wave guide 270 overlaps wave guide 272 wherein wave guide 270 supports communications between transceivers 260 and 256, while wave guide 272 supports communications between transceivers 254 and 262. At least in this example, the wave guides 270 and 272 are overlapping but isolated from each other to prevent the electromagnetic radiation therein from interfering with electromagnetic radiation of the other wave guide.

In general, it may be seen that the wave guides shown within substrate 250 support a plurality of directional communications between associated transceivers. In the embodiment of FIG. 6, the substrate may be either a board, such as a printed circuit board, or an integrated circuit wherein each transceiver is a transceiver block or module within the integrated circuit. In this embodiment of the invention, the wave guides are formed of a dielectric substrate material and are bounded to contain and isolate the electromagnetic signals transmitted therein. Further, as described in previous embodiments, the frequency of the electromagnetic signals is a very high radio frequency in the order of tens of GHz. In one specific embodiment, the frequency is equal to 60 GHz (+/−5 GHz). One aspect of this embodiment of the invention is that a transceiver may communicate to an intended transceiver by way of another transceiver. For example, if transceiver 252 seeks to deliver a communication to transceiver 256, transceiver 252 has the option of transmitting the communication signals by way of wave guides 264 and 266 through transceiver 254 or, alternatively, by wave guides 268 and 270 through transceiver 260.

Figure 7:
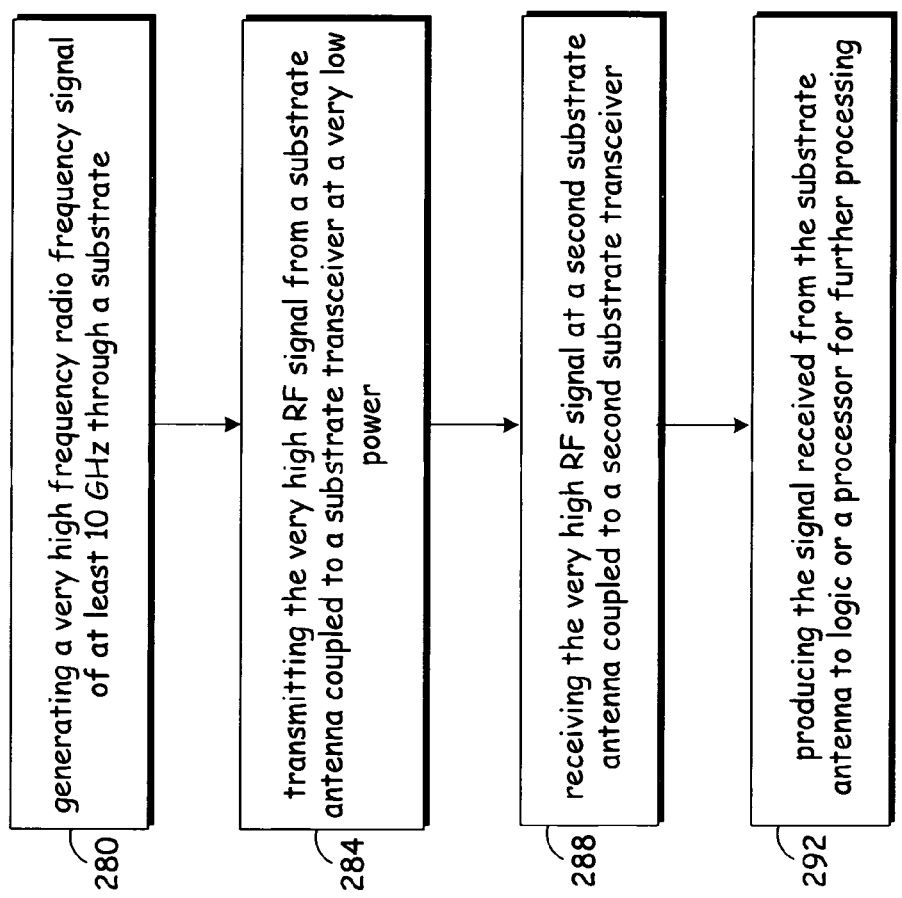
FIG. 7 is a flow chart of a method according to one embodiment of the present invention.

FIG. 7 is a flow chart of a method according to one embodiment of the present invention. The method includes initially generating a very high radio frequency signal of at least 10 GHz (step 280). In one embodiment of the invention, the very high radio frequency signal is a 60 GHz (+/−5 GHz) signal. Thereafter the method includes transmitting the very high radio frequency signal from a substrate antenna coupled to a substrate transceiver at a very low power (step 284). Because the electromagnetic radiation of the signal is being radiated through a substrate instead of through space, lower power is required. Moreover, because the substrate is operable as a wave guide with little or no interference, even less power is required because power is not required to overcome significant interference. Thereafter the method includes receiving the very high radio frequency signal at a second substrate antenna coupled to a second substrate transceiver (step 288). Finally, the method includes producing the signal received from the substrate antenna to logic or a processor for further processing (step 292). Generally, the method of FIG. 7 relates to the transmission of electromagnetic signals through a substrate of a printed circuit board, a board that houses integrated circuits or die, or even through an integrated circuit substrate material. In general, the substrate is formed of a dielectric material and is operable as a wave guide.

Figure 8:
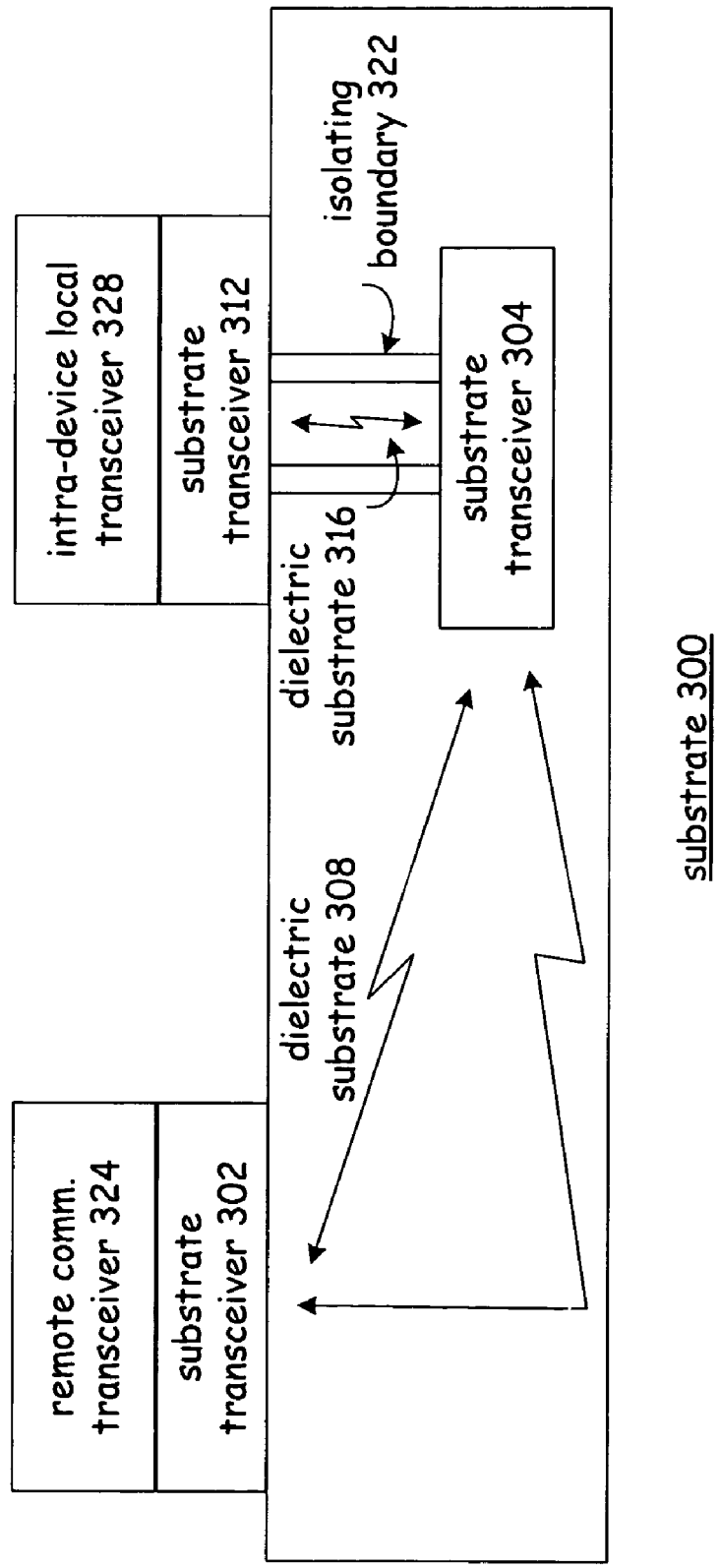
FIG. 8 is a functional block diagram of a substrate illustrating three levels of transceivers according to one embodiment of the present invention.

FIG. 8 is a functional block diagram of a substrate 300 illustrating three levels of transceivers according to one embodiment of the present invention. As may be seen, a substrate transceiver 302 is operably disposed upon a surface of a dielectric substrate to communicate with a substrate transceiver 304 through dielectric substrate 308. Substrate transceiver 304 is further operable to communicate with substrate transceiver 312 that also is operably disposed upon a surface of dielectric substrate 308. As may be seen, substrate transceiver 304 is embedded within dielectric substrate 308. To reduce or eliminate interference between communication signals between substrate transceivers 312 and 304, in relation to communications between substrate transceivers 302 and 304, a dielectric substrate 316 that is isolated by an isolating boundary 322 is used to conduct the communications between substrate transceiver 312 and substrate transceiver 304. In one embodiment of the invention, the isolating boundary is formed of metal.

In an alternate embodiment, the isolating boundary is merely a different type of dielectric or other material that generates a boundary to operably reflect electromagnetic radiation away from the dielectric substrate surface containing the electromagnetic signal. As such, the isolating boundaries within the dielectric, here within dielectric substrate 308, are used to define the volume of dielectric substrate illustrated as dielectric substrate 316 to create a wave guide between substrate transceiver 304 and substrate transceiver 312. In yet another alternate embodiment, rather than creating isolated wave guides within the primary dielectric substrate, here dielectric substrate 308, directional antennas may be used to reduce or eliminate interference between signals going to different substrate transceivers. For example, if each substrate transceiver shown utilized directional antennas, then, with proper placement and alignment of substrate antennas, interference may be substantially reduced thereby avoiding the need for the creation of isolating boundaries that define a plurality of wave guides within a dielectric substrate.

Continuing to examine FIG. 8, it may be seen that a remote communication transceiver 324 is operably disposed to communicate with substrate transceiver 302, while an intra-system local transceiver 328 is operably disposed to communicate with substrate transceiver 312. In the described embodiment of the invention, the intra-system or intra-device transceiver 328 is a local transceiver for short range local wireless communications through space with other local intra-device transceivers 328. References to "local" are made to indication a device that is operable to generate wireless transmissions that are not intended for transceivers external to the device that houses the local transceiver.

In one embodiment, a low efficiency antenna may be used for communications between local intra-device transceivers and between substrate transceivers. Because the required transmission distance is very minimal since the transmissions are to local transceivers located on the same board, integrated circuit or device, local low efficient antenna structures may be utilized. Moreover by using a very high radio frequency that is at least 10 GHz, and, in one embodiment, by utilizing a frequency band of approximately 55 GHz to 65 GHz, such low efficiency antenna structures have electromagnetic properties that support operation within the desired high frequency band.

Remote communication transceiver 324, on the other hand, is for communicating with remote transceivers external to the device that houses substrate 300. Thus, for example, if intra-device transceiver 328 were to receive a short range wireless communication from another local intra-device transceiver, intra-device transceiver 328 could operably conduct the received signals to substrate transceiver 312 which would then be operable to conduct the signals through dielectric substrate 316 to substrate transceiver 304 which, in turn, could radiate the signals to substrate transceiver 302 for delivery to remote communication transceiver 324. Network/Device transceiver 324 could then transmit the communication signals in the form of electromagnetic radiation to a remote wireless transceiver.

It should be understood that the described operation herein is but one exemplary embodiment that corresponds to the block diagram of FIG. 8. Alternatively, such communication signals may be relayed through more or less substrate transceivers to conduct the communication signals from one location to another. For example, in one alternate embodiment, only substrate transceivers 312 and 302 would be used for such communications to deliver signals from intra-device transceiver 328 to remote communication transceiver 324 or vice versa.

More generally, as may be seen, the block diagram of FIG. 8 illustrates three levels of transceivers. First, substrate transceivers are used for radiating electromagnetic signals at a very high frequency through a dielectric substrate which may be formed in a board that houses integrated circuits or die, in a printed circuit board, or even within a substrate of an integrated circuit. A second level of transceiver is the intra-device local transceiver, such as intra-device transceiver 328, for generating very short range wireless communication signals through space to other local intra-device transceivers. As described before, such local transceivers are for local communications all contained within a specified device. Finally, the third level of transceiver is the remote communication transceiver 324 which is a remote transceiver for wireless communications with remote devices external to the device housing substrate 300 in each of these transceivers.

Figure 9:
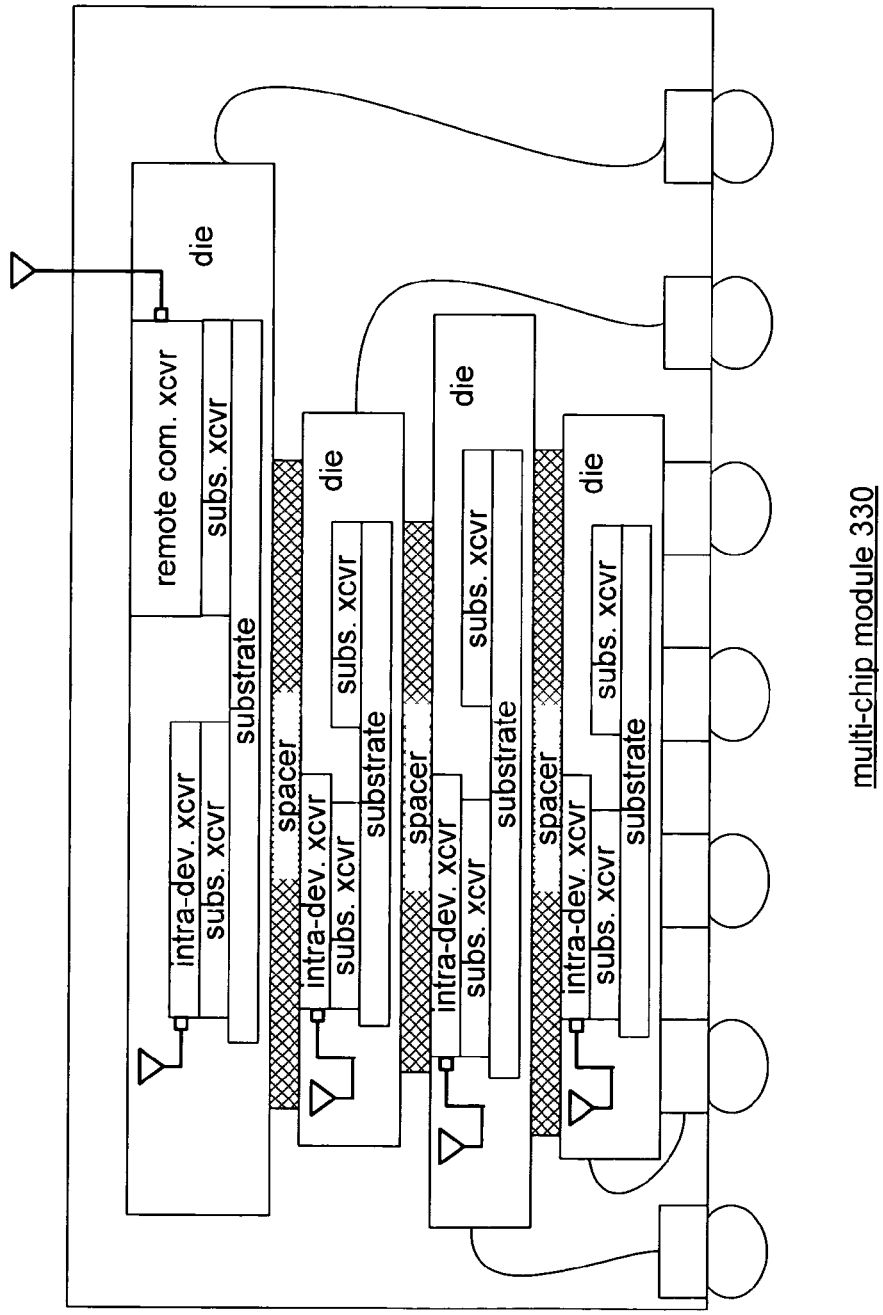
FIG. 9 is a functional block diagram of a multi-chip module formed according to one embodiment of the present invention.

FIG. 9 is a functional block diagram of a multi-chip module formed according to one embodiment of the present invention. As may be seen, a multi-chip module 330 includes a plurality of die that each includes a plurality of substrate transceivers, and at least one intra-device local transceiver. Moreover, at least one of the die includes a remote communication transceiver for communications with remote devices. While a multi-chip module is not required to include a remote communication transceiver for communications with other remote devices, the embodiment shown in FIG. 9 does include such a remote communication transceiver.

As may be seen, each die is separated from an adjacent die by a spacer. As such, in the illustrated embodiment, a plurality of four die are included, which four die are operably separated by three spacers. Each of the four die includes two substrate transceivers that are operable to communicate through a dielectric substrate operable as a wave guide. Additionally, at least one substrate transceiver is communicatively coupled to an intra-device transceiver for radiating wireless communication signals through space to another intra-device local transceiver within the multi-chip module of FIG. 9.

In one embodiment of the invention, at least one intra-device local transceiver is operable to generate transmission signals at a power level sufficient to reach another intra-device transceiver within a device, but not outside of the multi-chip module. The antennas for the substrate transceivers are not shown for simplicity but they may be formed as described elsewhere here in this specification.

As may further be seen, each of the intra-device local transceivers includes a shown antenna for the local wireless transmissions through space. In the described embodiment of the invention, the wireless communications within the multi-chip module of FIG. 9 are at least 10 GHz in frequency and, in one embodiment, are approximately equal to 60 GHz. The remote transceiver, as shown, may operate at approximately the same frequency or a different frequency according to design preferences and according to the intended remote devices with which the multi-chip module of FIG. 9 is to communicate.

Continuing to refer to FIG. 9, it should be understood that each of the embodiments shown previously for substrates and substrate transceivers may be utilized here in the multi-chip module of FIG. 9. Accordingly, a given substrate may have more than two substrate transceivers which substrate transceivers may be operably disposed on top of the substrate or within the substrate. Similarly, the antennas for such substrate transceivers, namely the substrate antennas, may be operably disposed upon a surfaces substrate or to at least partially, if not fully, penetrate the substrate for the radiation of electromagnetic signals therein. Moreover, a plurality of wave guides may be formed within the substrate to direct the electromagnetic signals therein from one desired substrate transceiver antenna to another desired substrate transceiver antenna.

In operation, for exemplary purposes, one substrate transceiver of a die may use the substrate to generate communication signals to another substrate transceiver for delivery to an intra-device local transceiver for subsequent radiation through space to yet another substrate and, more specifically, to an intra-device local transceiver operably disposed upon another substrate. As will be described in greater detail below, a specific addressing scheme ray be used to direct communications to a specific intra-device local transceiver for further processing. For example, if a communication signal is intended to be transmitted to a remote device, such communication signal processing will occur to result in a remote transceiver receiving the communication signals by way of one or more substrates, substrate transceivers, and intra-device local transceivers.

Continuing to refer to FIG. 9, it should be noted that in addition to transmitting signals through a substrate at a lower power level, the power level for wireless transmissions between intra-device local transceivers may also be at a lower power level. Moreover, higher levels of modulation may be used based on the type of transmission. For example, for transmissions through a wave guide in a substrate, the highest orders of modulation may be used. For example, a signal may be modulated as a 128 QAM signal or as a 256 QAM signal. Alternatively, for intra-device local transceiver transmissions, the modulation may still be high, e.g., 64 QAM or 128 QAM, but not necessarily the highest levels of modulation. Finally, for transmissions from a remote transceiver to a remote device, more traditional modulation levels, such as QPSK or 8 PSK may be utilized according to expected interference conditions for the device.

In one embodiment of the invention, at least one die is a flash memory chip that is collocated within the same device that a processor. The intra-device transceivers are operable to establish a high data rate communication channel to function as a memory bus. As such, no traces or lines are required to be routed from the flash memory die to the processor die. Thus, the leads shown in FIG. 9 represent power lines to provide operating power for each of the die. At least some of the die, therefore, use wireless data links to reduce pin out and trace routing requirements. Continuing to refer to FIG. 9, other application specific devices may be included. For example, one die may include logic that is dedicated for other functions or purposes.

One aspect of the embodiment of FIGS. 8 and 9 is that a remote device may, by communicating through the remote communication transceiver and then through the intra-device and/or substrate transceivers within a device or integrated circuit, access any specified circuit module within the device to communicate with the device. Thus, in one embodiment, a remote tester is operable to communicate through the remote communication transceiver of the device housing the substrate of FIG. 8 or the multi-chip module of FIG. 9 and then through communicatively coupled intra-device transceivers to test any or all of the circuit modules within. Alternatively, a remote device may use the remote communication transceiver and intra-device and/or substrate local transceivers to access any resource within a device. For example, a remote device may access a memory device, a processor or a specialized application (e.g. a sensor) through such a series of communication links. A further explanation of these concepts may also be seen in reference to FIGS. 25 and 26.

Figure 10:
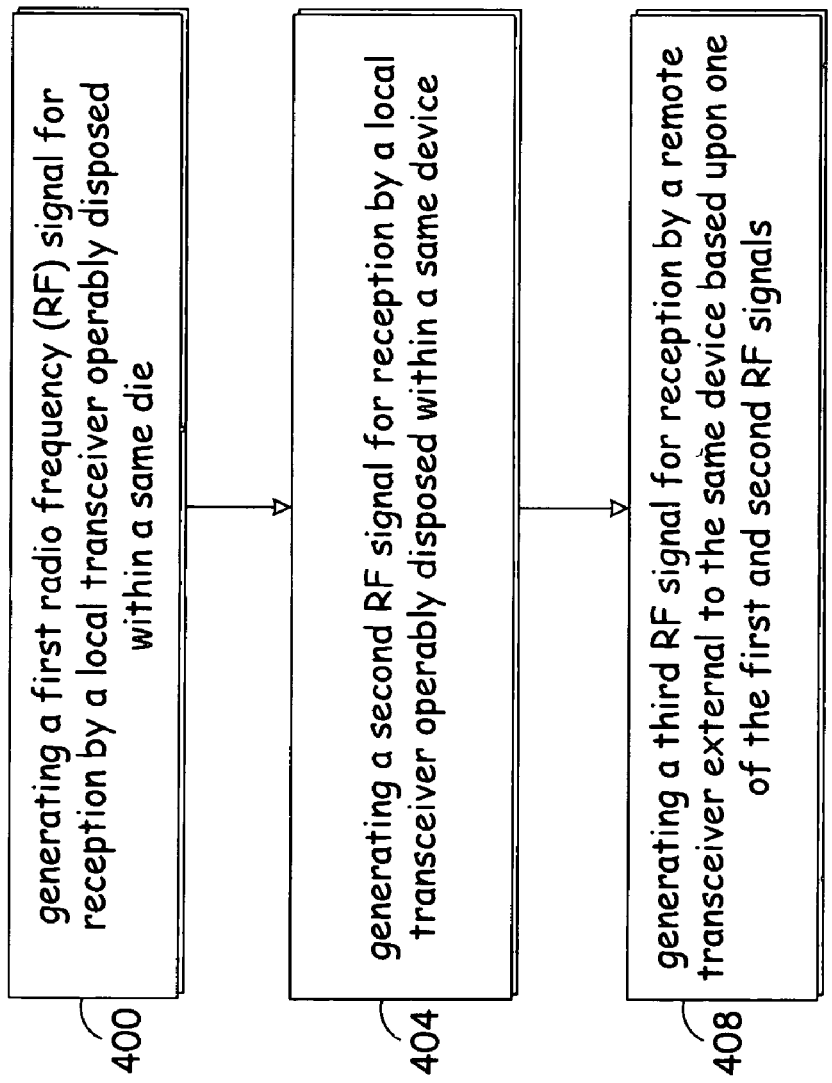
FIG. 10 is a flow chart of a method for communicating according to one embodiment of the present invention.

FIG. 10 is a flow chart of a method for communicating according to one embodiment of the present invention. The method includes generating a first radio frequency signal for reception by a local transceiver operably disposed within a same die (step 340). A second step includes generating a second RF signal for reception by a local transceiver operably disposed within a same device (step 344). Finally, the method includes generating a third RF signal for reception by a remote transceiver external to the same device based upon one of the first and second RF signals (step 348).

In one embodiment of the present invention, the first, second and third RF signals are generated at different frequency ranges. For example, the first radio frequency signals may be generated at 60 GHz, while the second RF signals are generated at 30 GHz, while the third RF signals are generated at 2.4 GHz. Alternatively, in one embodiment of the invention, the first, second and third RF signals are all generated at a very high and substantially similar frequency. For example, each might be generated as a 60 GHz (+/−5 GHz) signal. It is understood that these frequencies refer to the carrier frequency and may be adjusted slightly to define specific channels of communication using frequency division multiple access-type techniques. More generally, however, at least the first and second RF signals are generated at a frequency that is at least as high as 10 GHz.

Figure 11:
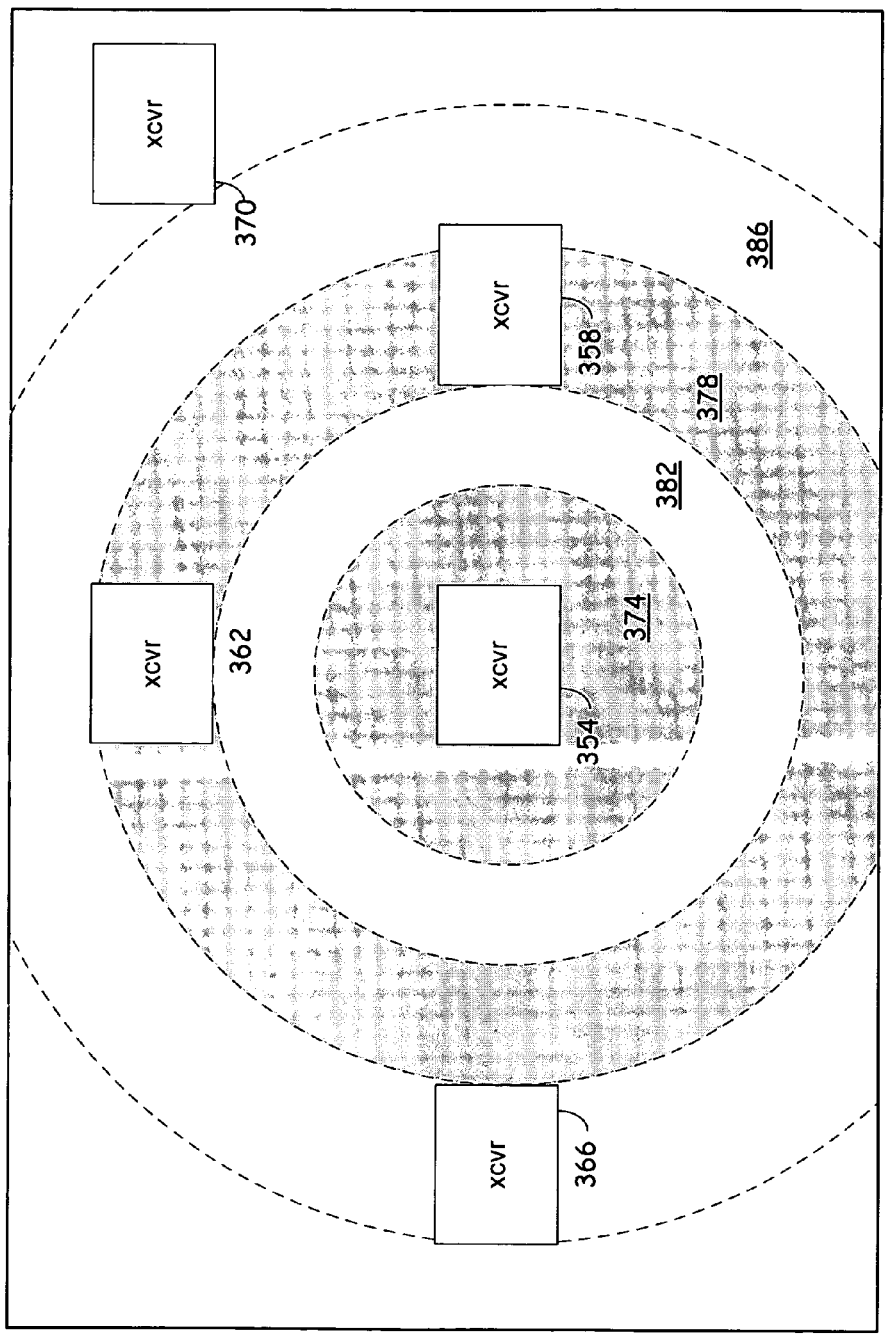
FIG. 11 is a diagram that illustrates transceiver placement within a substrate according to one embodiment of the present invention.

FIG. 11 is a diagram that illustrates transceiver placement within a substrate according to one embodiment of the present invention. As may be seen, a substrate 350 includes a plurality of transceivers 354, 358, 362, 366 and 370, that are operably disposed in specified locations in relation to each other to support intended communications there between. More specifically, the transceivers 354-370 are placed within peak areas and null areas according to whether communication links are desired between the respective transceivers. The white areas within the concentric areas illustrate subtractive signal components operable to form a signal null, while the shaded areas illustrate additive signal components operable to form a signal peak.

More specifically, it may be seen that transceiver 354 is within a peak area of its own transmissions, which peak area is shown generally at 374. Additionally, a peak area may be seen at 378. Null areas are shown at 382 and 386. Peak areas 374 and 378 and null areas 382 and 386 are in relation to transceiver 354. Each transceiver, of course, has its own relative peak and null areas that form about its transmission antenna. One aspect of the illustration of FIG. 11 is that transceivers are placed within peak and null areas in relation to each other according to whether communication links are desired between the respective transceivers.

One aspect of the embodiment of FIG. 11 is that a device may change frequencies to obtain a corresponding null and peak pattern to communicate with specified transceivers. Thus, if transceiver 354 wishes to communicate with transceiver 366 (which is in a null region for the frequency that generates the null and peak patterns shown in FIG. 11), transceiver 354 is operable to change to a new frequency that produces a peak pattern at the location of transceiver 366. As such, if a dynamic frequency assignment scheme is used, frequencies may desirably be changed to support desired communications.

Figure 12:
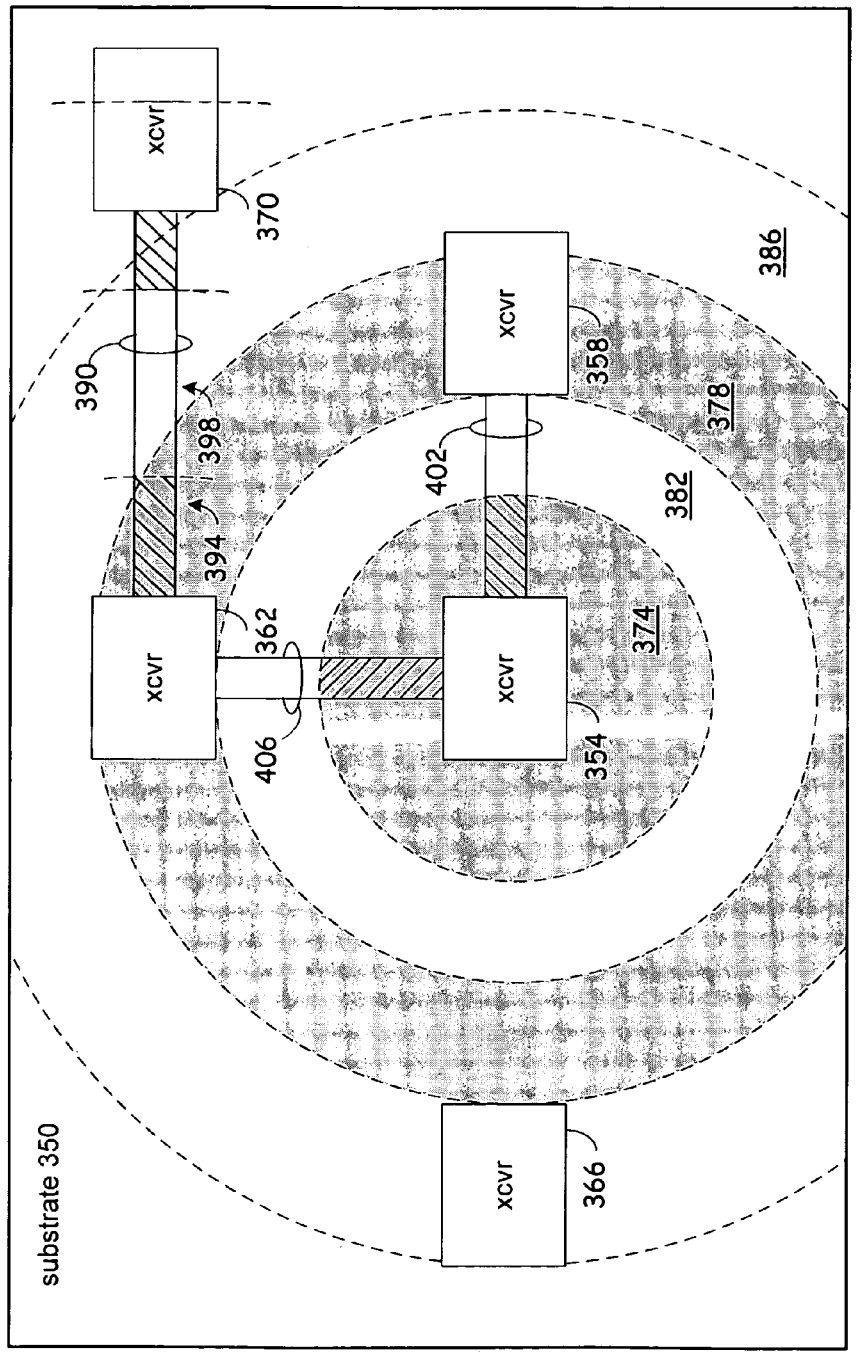
FIG. 12 is an illustration of an alternate embodiment of a substrate.

FIG. 12 is an illustration of an alternate embodiment of a substrate 350 that includes the same circuit elements as in FIG. 11 but also includes a plurality of embedded wave guides between each of the transceivers to conduct specific communications there between. As may be seen, transceiver 354 is operable to communicate with transceiver 358 over a dedicated wave guide 402. Similarly, transceiver 354 is operable to communicate with transceiver 362 over a dedicated waveguide 406. Thus, with respect to transceiver 362, peak area 394 and null area 398 are shown within isolated substrate 390.

Wave guide 390 couples communications between transceivers 362 and 370. While the corresponding multi-path peaks and nulls of FIG. 11 are duplicated here in FIG. 12 for transceiver 354, it should be understood that the electromagnetic signals are being conducted between the transceivers through the corresponding wave guides in one embodiment of the invention. Also, it should be observed that the actual peak and null regions within the contained wave guides are probably different than that for the general substrate 350 but, absent more specific information, are shown to correspond herein. One of average skill in the art may determine what the corresponding peak and null regions of the isolated wave guides 402, 406 and 390 will be for purposes of communications that take advantage of such wave guide operational characteristics.

Figure 13:
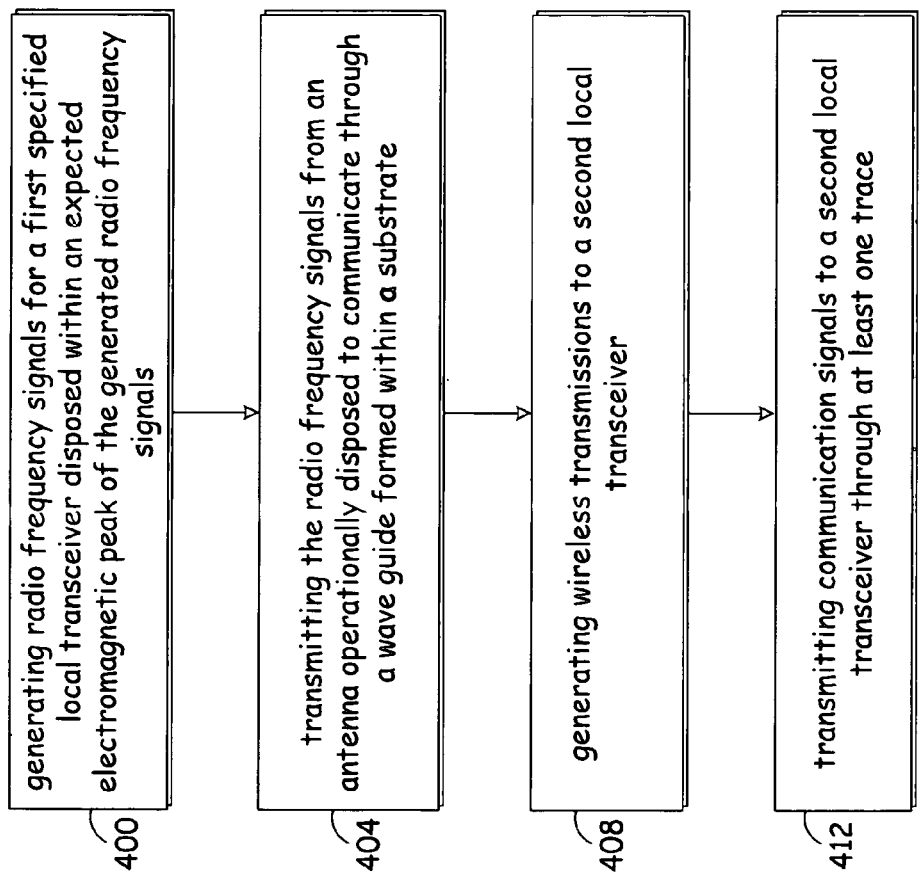
FIG. 13 is a flow chart that illustrates a method according to one embodiment of the present invention.

FIG. 13 is a flow chart that illustrates a method according to one embodiment of the present invention. The method includes initially generating radio frequency signals for a first specified local transceiver disposed within an expected electromagnetic peak of the generated radio frequency signals (step 400). The expected electromagnetic peak is a multi-path peak where multi-path signals are additive. The signals that are generated are then transmitted from an antenna that is operationally disposed to communicate through a wave guide formed within a substrate (step 404). The substrate may be that of a board, such as a printed circuit board, or of a die, such as an integrated circuit die.

The method also includes generating wireless transmissions to a second local transceiver through either the same or a different and isolated wave guide (step 408). Optionally, the method of FIG. 13 includes transmitting communication signals to a second local transceiver through at least one trace (step 412). As may be seen, transmissions are not specifically limited to electromagnetic signal radiations through space or a wave guide or, more generally, through a substrate material such as a dielectric substrate.

Figure 14:
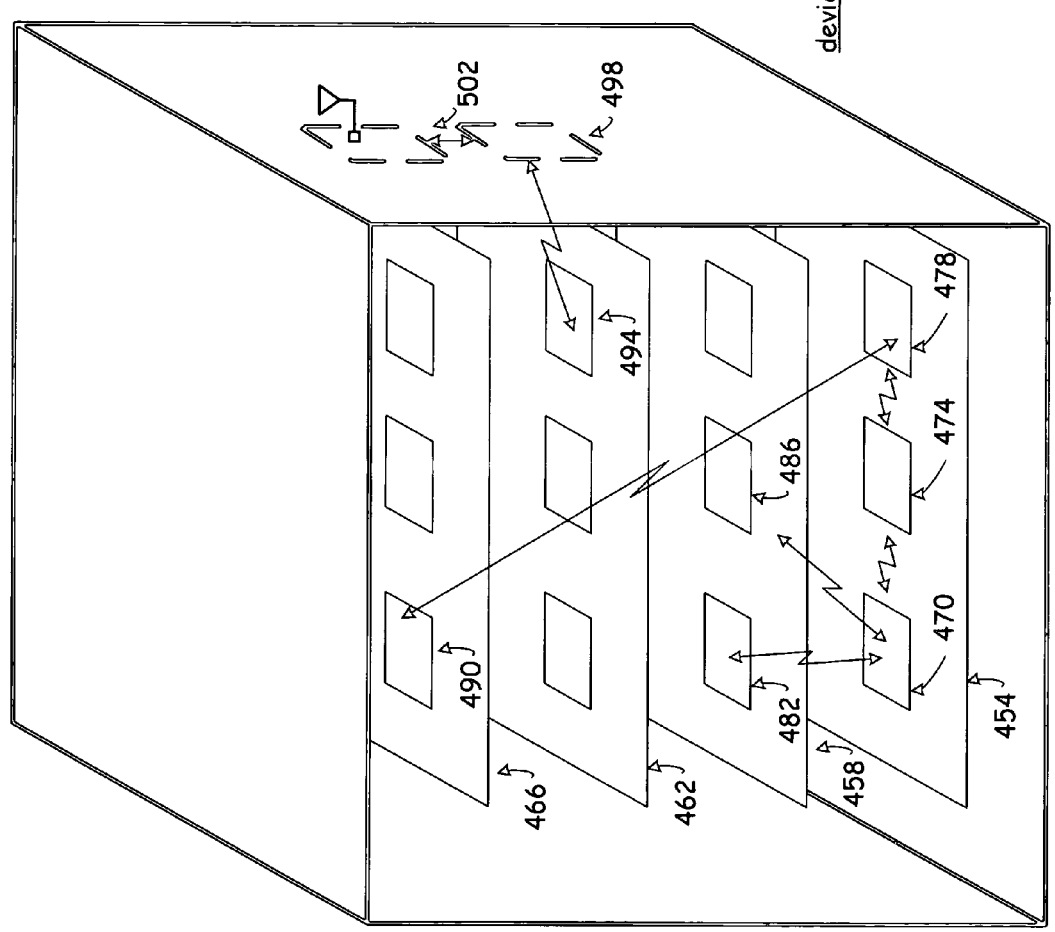
FIG. 14 is a functional block diagram of an integrated circuit multi-chip device and associated communications according to one embodiment of the present invention.

FIG. 14 is a functional block diagram of an integrated circuit multi-chip device and associated communications according to one embodiment of the present invention. As may be seen, a device 450 includes a plurality of circuit boards 454, 458, 462 and 466, that each houses a plurality of die. The die may be packaged or integrated thereon. The device of FIG. 14 may represent a device having a plurality of printed circuit boards, or alternatively, a multi-chip module having a plurality of integrated circuit die separated by spacers. As may be seen, board 454 includes transceivers 470, 474, and 478 that are operable to communicate with each other by way of local transceivers. In one embodiment of the invention, the local transceivers are substrate transceivers that generate electromagnetic radiations through wave guides within board 454.

As stated before, board 454 may be a board such as a printed circuit board that includes a dielectric substrate operable as a wave guide, or may be an integrated circuit that includes a dielectric wave guide for conducting the electromagnetic radiation. Alternatively, the transceivers 470, 474, and 478, may communicate by way of intra-device local transceivers that transmit through space but only for short distances. In one embodiment of the invention, the local intra-device transceivers are 60 GHz transceivers having very short wavelength and very short range, especially when a low power is used for the transmission. In the embodiment shown, power would be selected that would be adequate for the electromagnetic radiation to cover the desired distances but not necessarily to expand a significant distance beyond.

As may also be seen, transceiver 470 is operable to communicate with a transceiver 482 that is operably disposed on board 458 and with a transceiver 486 that is operably disposed on board 458. In this case, local intra-device wireless transceivers for transmitting through space are required since transceivers 482 and 486 are placed on a different or integrated circuit die. Similarly, transceiver 478 is operable to communicate with transceiver 490 that is operably disposed on board 466. As before, transceiver 478 and transceiver 490 communicate utilizing local intra-device wireless transceivers. As may also be seen, a local intra-device transceiver 494 on board 462 is operable to communicate with a local intra-device transceiver 498 that further includes an associated remote transceiver 502 for communicating with remote devices. As may be seen, remote transceiver 502 and local transceiver 498 are operatively coupled. Thus, it is through transceiver 502 that device 450 communicates with external remote devices.

In one embodiment of the present invention, each of the boards 454, 458, 462, and 466, are substantially leadless boards that primarily provide structural support for bare die and integrated circuits. In this embodiment, the chip-to-chip communications occur through wave guides that are operably disposed between the various integrated circuit or bare die, or through space through local wireless intra-device transceivers. Alternatively, if each board 454-466 represents a printed circuit board, then the wireless communications, whether through a substrate or through space, augment and supplement any communications that occur through traces and lead lines on the printed circuit board.

One aspect of the embodiment of device 450 shown in FIG. 14 is that of interference occurring between each of the wireless transceivers. While transmissions through a wave guide by way of a dielectric substrate may isolate such transmissions from other wireless transmissions, there still exist a substantial number of wireless transmissions through space that could interfere with other wireless transmissions all within device 450. Accordingly, one aspect of the present invention includes a device that uses frequency division multiple access for reducing interference within device 450.

Figure 15:
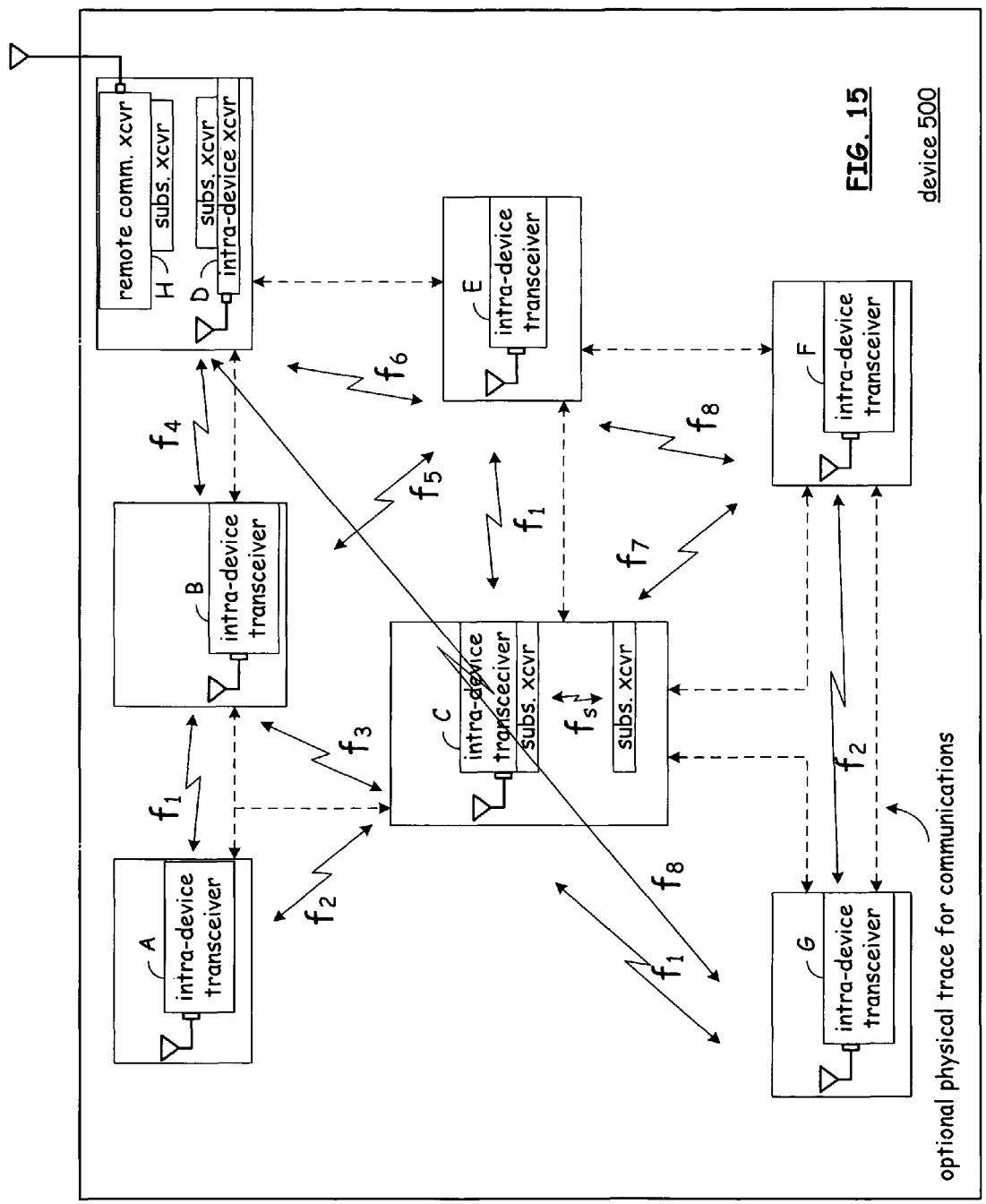
FIG. 15 is a functional block diagram that illustrates operation of one embodiment of the present invention utilizing frequency division multiple access.

FIG. 15 is a functional block diagram that illustrates operation of one embodiment of the present invention utilizing frequency division multiple access for communication within a device. As may be seen in the embodiment of FIG. 15, a device 500 includes intra-device local transceiver A is operable to communicate with intra-device local transceiver B and C utilizing $f_1$ and $f_2$ carrier frequencies. Similarly, intra-device local transceivers B and C communicate using $f_3$ carrier frequency. Intra-device local transceiver B also communicates with intra-device local transceiver D and E utilizing $f_4$ and $f_5$ carrier frequencies. Intra-device local transceiver D communicates with intra-device local transceiver E using $f_6$ carrier frequency. Because of space diversity (including range differentiation), some of these frequencies may be reused as determined by a designer. Accordingly, as may be seen, $f_1$ carrier frequency may be used between intra-device local transceivers C and E, as well as C and G. While $f_7$ carrier frequency is used for communications between intra-device local transceivers C and F, $f_8$ carrier frequency may be used for communications between intra-device local transceivers E and F, as well as D and G. Finally, intra-device local transceivers F and G are operable to communicate using $f_2$ carrier frequency. As may be seen, therefore, $f_1$, $f_2$, and $f_8$ carrier frequency signals have been reused in the frequency plan of the embodiment of FIG. 15.

Another aspect of the topology of FIG. 15 is that within the various die or transceivers, according to application, substrate transceivers exist that also use a specified carrier frequency for transmissions through the dielectric substrate wave guides. Here in FIG. 15, such carrier frequency is referred to simply as $f_s$. It should be understood that $f_s$ can be any one of $f_1$ through $f_8$ in addition to being yet a different carrier frequency $f_9$ (not shown in FIG. 15).

As described before in this specification, the substrate transceivers are operable to conduct wireless transmissions through a substrate forming a wave guide to couple to circuit portions. Thus, referring back to FIG. 15, for transmissions that are delivered to intra-device local transceiver D for delivery to remote transceiver H, a pair of local substrate transceivers are utilized to deliver the communication signals received by intra-device local transceiver D to remote transceiver H for propagation as electromagnetic signals through space to another remote transceiver.

Generally, in the frequency plan that is utilized for the embodiment of FIG. 15, the transceivers are statically arranged in relation to each other. As such, concepts of roaming and other such known problems do not exist. Therefore, the carrier frequencies, in one embodiment, are permanently or statically assigned for specific communications between named transceivers. Thus, referring to FIG. 16 now, a table is shown that provides an example of the assignment static or permanent assignment of carrier frequencies to specified communications between intra-device local transceivers, substrate transceivers, and other transceivers within a specified device. For example, $f_1$ carrier frequency is assigned to communications between transceivers A and B.

A carrier frequency is assigned for each communication link between a specified pair of transceivers. As described in relation to FIG. 15, space diversity will dictate what carrier frequencies may be reused if desired in one embodiment of the invention. As may also be seen, the embodiment of FIG. 16 provides for specific and new carrier frequency assignments for communications between specific substrate transceivers, such as substrate transceiver M and substrate transceiver N and substrate transceiver M with substrate transceiver O. This specific example is beneficial, for example, in an embodiment having three or more substrate transceivers within a single substrate, whether that single substrate is an integrated circuit or a printed circuit board. As such, instead of using isolated wave guides as described in previous embodiments, frequency diversity is used to reduce interference.

Referring back to FIG. 15, it may be seen that a plurality of dashed lines are shown operatively coupling the plurality of intra-device local transceivers. For example, one common set of dashed lines couples transceivers A, B and C. On the other hand, dashed lines are used to couple transceivers C and G, C and F, and G and F. Each of these dashed lines shown in FIG. 15 represents a potential lead or trace that is used for carrying low bandwidth data and supporting signaling and power. Thus, the wireless transmissions are used to augment or add to communications that may be had by physical traces. This is especially relevant for those embodiments in which the multiple transceivers are operably disposed on one or more printed circuit boards.

One aspect of such a system design is that the wireless transmissions may be utilized for higher bandwidth communications within a device. For example, for such short range wireless transmissions where interference is less of a problem, higher order modulation techniques and types may be utilized. Thus, referring back to FIG. 16, exemplary assignments of frequency modulation types may be had for the specified communications. For example, for wireless communication links between transceivers A, B, C, D, E, F and G, either 128 QAM or 64 QAM is specified for the corresponding communication link as the frequency modulation type. However, for the communication link between intra-device local transceivers G and D, 8 QAM is specified as the frequency modulation type to reflect a greater distance and, potentially, more interference in the signal path. On the other hand, for the wireless communication links between substrate transceivers, the highest order modulation known, namely 256 QAM, is shown as being assigned since the wireless transmissions are through a substrate wave guide that has little to no interference and is power efficient. It should be understood that the assigned frequency modulation types for the various communication links are exemplary and may be modified according to actual expected circuit conditions and as is identified by test. One aspect that is noteworthy, however, of this embodiment, is that frequency subcarriers and frequency modulation types, optionally, may be statically assigned for specified wireless communication links.

Figure 17:
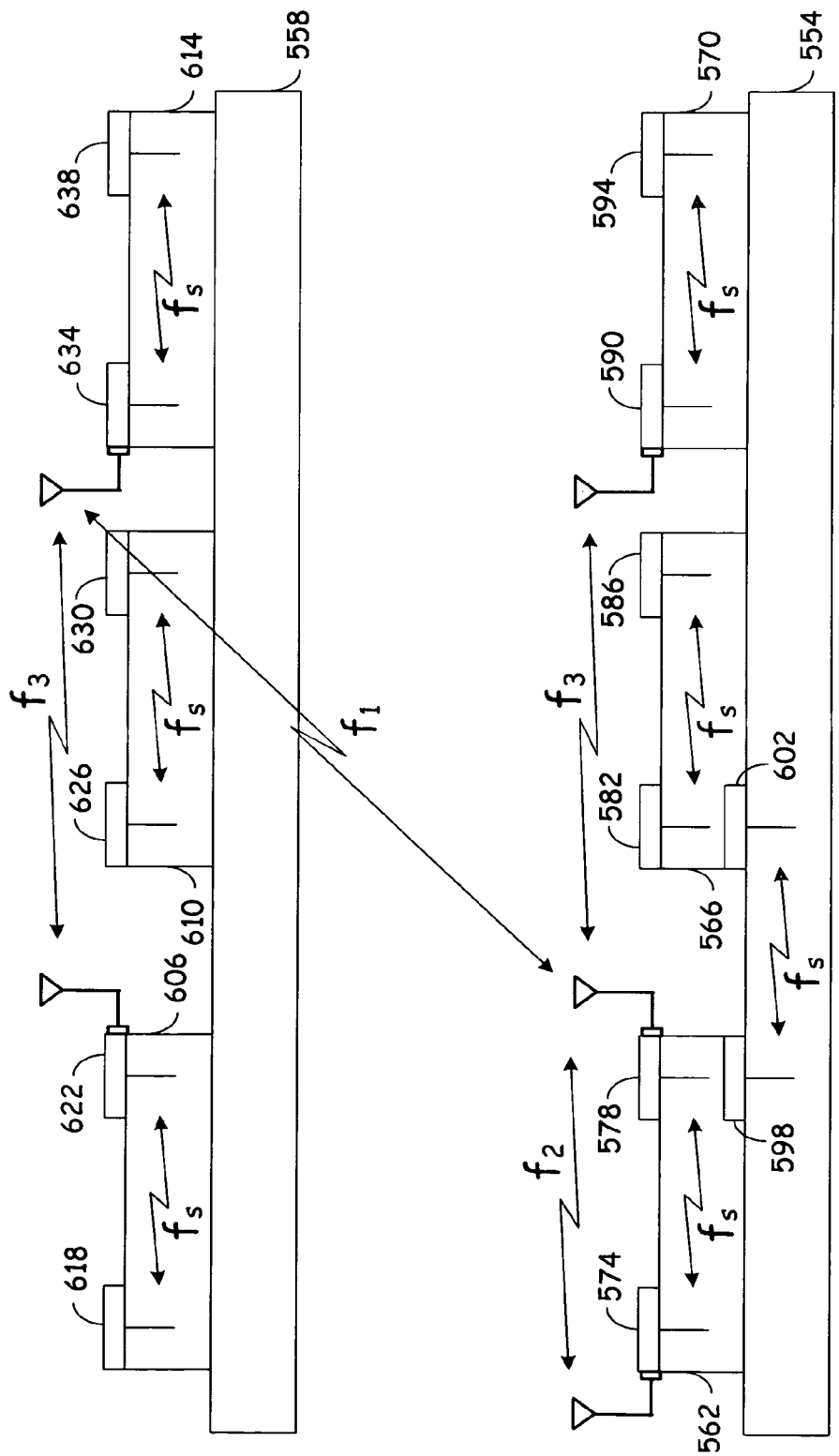
FIG. 17 is a functional block diagram of a device housing a plurality of transceivers and operating according to one embodiment of the present invention.

FIG. 17 is a functional block diagram of a device 550 housing a plurality of transceivers and operating according to one embodiment of the present invention. Referring to FIG. 17, a pair of substrates 554 and 558 are shown which each include a plurality of substrates disposed thereon, which substrates further include a plurality of transceivers disposed thereon. More specifically, substrate 554 includes substrates 562, 566 and 570, disposed thereon. Substrate 562 includes transceivers 574 and 578 disposed thereon, while substrate 566 includes transceivers 582 and 586 disposed thereon. Finally, substrate 570 includes transceivers 590 and 594 disposed thereon. Similarly, substrate 558 includes substrates 606, 610 and 614.

Substrate 606 includes transceivers 618 and 622, while substrate 610 includes transceivers 626 and 630 disposed thereon. Finally, substrate 614 includes transceivers 634 and 638 disposed thereon. Operationally, there are many aspects that are noteworthy in the embodiments of FIG. 17. First of all, transceivers 574 and 578 are operable to communicate through substrate 562 or through space utilizing assigned carrier frequency $f_2$. While not specifically shown, transceivers 574 and 578 may comprise stacked transceivers, as described before, or may merely include a plurality of transceiver circuit components that support wireless communications through space, as well as through the substrate 562. Similarly, substrate 566 includes substrate transceivers 582 and 586 that are operable to communicate through substrate 566 using carrier frequency $f_3$, while substrate 570 includes transceivers 590 and 594 that are operable to communicate through substrate 570 using carrier frequency $f_s$.

As may also be seen, transceiver 590 of substrate 570 and transceiver 578 of substrate 562 are operable to communicate over a wireless communication link radiated through space (as opposed to through a substrate). On the other hand, substrate 562 and substrate 566 each include substrate transceivers 598 and 602 that are operable to communicate through substrate 554. As such, layered substrate communications may be seen in addition to wireless localized communications through space. As may also be seen, transceiver 578 of substrate 562 is operable to communicate with transceiver 634 of substrate 614 which is disposed on top of substrate 558. Similarly, transceiver 634 is operable to wirelessly communicate by radiating electromagnetic signals through space with transceiver 622 which is operably disposed on substrate 606. Transceivers 622 and 618 are operable to communicate through substrate 606, while transceivers 626 and 630 are operable to communicate through substrate 610. Finally, transceiver 634 is operable to communicate through substrate 614 with transceiver 638.

While not shown herein, it is understood that any one of these transceivers may communicate with the other transceivers and may include or be replaced by a remote transceiver for communicating with other remote devices through traditional wireless communication links. With respect to a frequency plan, as may be seen, a frequency $f_1$ is assigned for the communication link between transceivers 578 and 634, while carrier frequency $f_2$ is assigned for transmissions between transceivers 574 and 578. Carrier frequency $f_3$ is assigned for transmissions between transceivers 578 and 590, as well as 622 and 634. Here, space diversity, as well as assigned power levels, is used to keep the two assignments of carrier frequency $f_3$ from interfering with each other and creating collisions.

As another aspect of the present embodiment of the invention, the carrier frequencies may also be assigned dynamically. Such a dynamic assignment may be done by evaluating and detecting existing carrier frequencies and then assigning new and unused carrier frequencies. Such an approach may include, for example, frequency detection reporting amongst the various transceivers to enable the logic for any associated transceiver to determine what frequency to dynamically assign for a pending communication. The considerations associated with making such dynamic frequency assignments includes the power level of the transmission, whether the transmission is with a local intra-device transceiver or with a remote transceiver, and whether the detected signal is from another local intra-device transceiver or from a remote transceiver.

Figure 18:
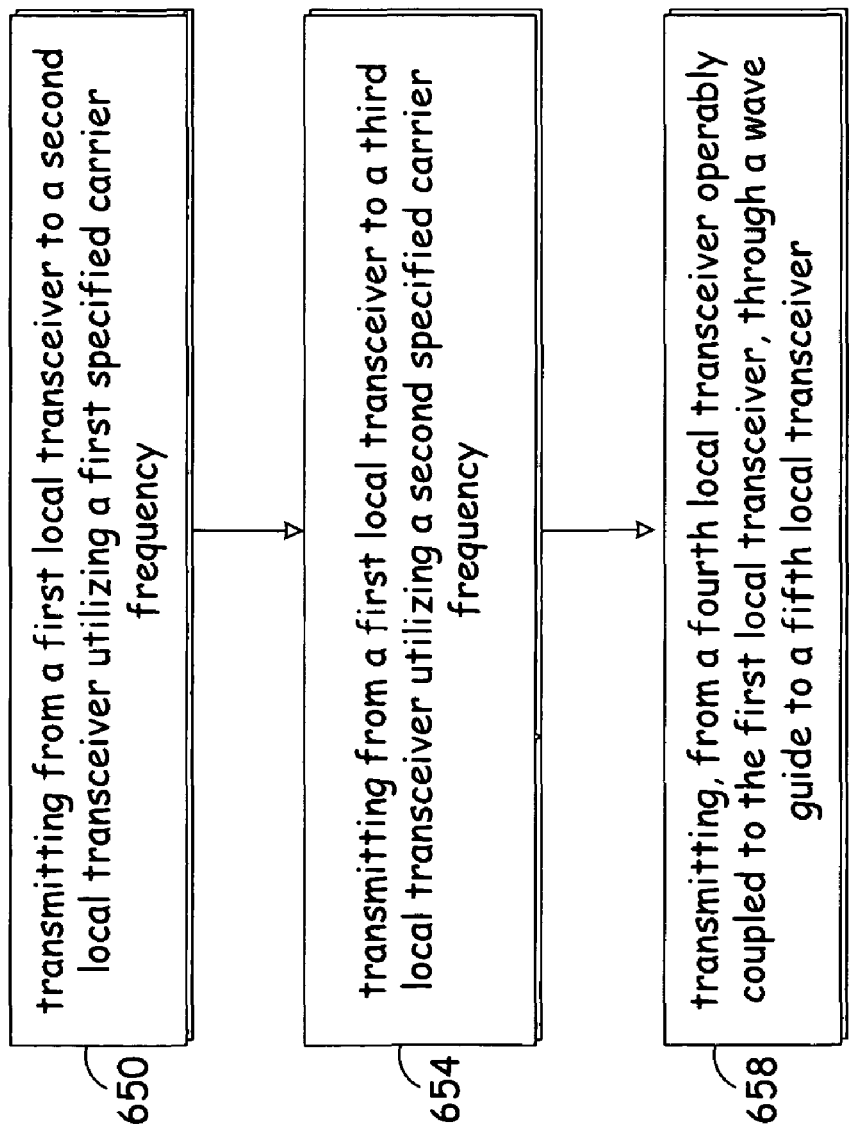
FIG. 18 is a flow chart that illustrates a method for wireless transmissions in an integrated circuit utilizing frequency division multiple access according to one embodiment of the invention.

FIG. 18 is a flow chart that illustrates a method for wireless transmissions in an integrated circuit utilizing frequency division multiple access according to one embodiment of the invention. The method includes, in a first local transceiver, generating and transmitting communication signals to a second local transceiver utilizing a first specified carrier frequency (step 650). The method further includes, in the first local transceiver, transmitting to a third local transceiver utilizing a second specified carrier frequency wherein the second local transceiver is operably disposed either within the integrated circuit or within a device housing the integrated circuit (step 654).

References to local transceivers are specifically to transceivers that are operably disposed within the same integrated circuit, printed circuit board or device. As such, the communication signals utilizing the frequency diversity are signals that are specifically intended for local transceivers and are, in most embodiments, low power high frequency radio frequency signals. Typical frequencies for these local communications are at least 10 GHz. In one specific embodiment, the signals are characterized by a 60 GHz carrier frequency.

These high frequency wireless transmissions may comprise electromagnetic radiations through space or through a substrate, and more particularly, through a wave guide formed by a dielectric substrate formed within a die of an integrated circuit or within a board (including but not limited to printed circuit boards). Thus, the method further includes transmitting from a fourth local transceiver operably coupled to the first local transceiver through a wave guide formed within the substrate to a fifth local transceiver operably disposed to communicate through the substrate (step 658).

In one embodiment of the invention, the fourth local transceiver utilizes a permanently assigned carrier frequency for the transmissions through the wave guide. In a different embodiment of the invention, the fourth local transceiver utilizes a determined carrier frequency for the transmissions through the wave guide, wherein the determined carrier frequency is chosen to match a carrier frequency being transmitted by the first local transceiver. This approach advantageously reduces a frequency conversion step.

With respect to the carrier frequencies for the electromagnetic radiations to other local transceivers through space, the first and second carrier frequencies are statically and permanently assigned in one embodiment. In an alternate embodiment, the first and second carrier frequencies are dynamically assigned based upon detected carrier frequencies. Utilizing dynamically assigned carrier frequencies is advantageous in that interference may further be reduced or eliminated by using frequency diversity to reduce the likelihood of collisions or interference. A disadvantage, however, is that more overhead is required in that this embodiment includes logic for the transmission of identified carrier frequencies or channels amongst the local transceivers to coordinate frequency selection.

Figure 19:
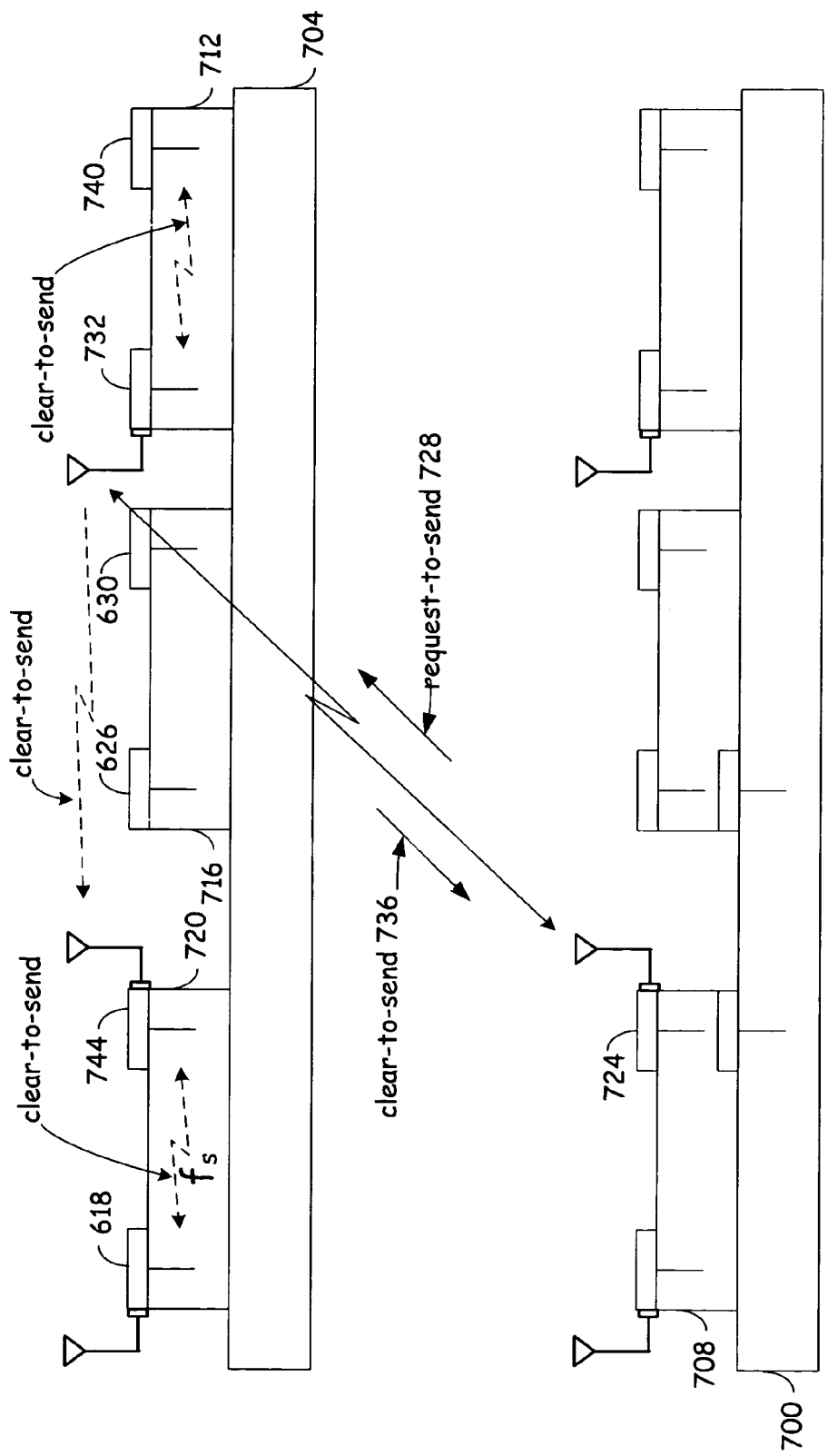
FIG. 19 is a functional block diagram that illustrates an apparatus and corresponding method of wireless communications within the apparatus for operably avoiding collisions and interference utilizing a collision avoidance scheme to coordinate communications according to one embodiment of the invention.

FIG. 19 is a functional block diagram that illustrates an apparatus and corresponding method of wireless communications within the apparatus for operably avoiding collisions and interference utilizing a collision avoidance scheme to coordinate communications according to one embodiment of the invention. More specifically, a plurality of local transceivers for local communications and at least one remote transceiver for remote communications operably installed on an integrated circuit or device board having a plurality of integrated circuit local transceivers are shown.

The collision avoidance scheme is utilized for communications comprising very high radio frequency signals equal to or greater than 10 GHz in frequency for local transceiver communications amongst local transceivers operably disposed within the same device and even within the same supporting substrate. Referring to FIG. 19, a plurality of local transceivers are shown that are operable to generate wireless communication signals to other local transceivers located on the same board or integrated circuit or with local transceivers on a proximate board (not shown here in FIG. 19) within the same device.

In addition to the example of FIG. 19, one may refer to other Figures of the present specification for support therefor. For example, FIGS. 9, 14 and 17 illustrate a plurality of boards/integrated circuits (collectively "supporting substrates") that each contain local transceivers operable to wirelessly communicate with other local wireless transceivers. In one embodiment, at least one supporting substrate (board, printed circuit board or integrated circuit die) is operable to support transceiver circuitry that includes one or more transceivers thereon. For the embodiments of the invention, at least three local transceivers are operably disposed across one or more supporting substrates, which supporting substrates may be boards that merely hold and provide power to integrated circuits, printed circuit boards that support the integrated circuits as well as additional circuitry, or integrated circuits that include radio transceivers.

For exemplary purposes, the embodiment of FIG. 19 includes first and second supporting substrates 700 and 704 for supporting circuitry including transceiver circuitry. A first radio transceiver integrated circuit 708 is supported by substrate 700, while a second, third and fourth radio transceiver integrated circuit die 712, 716 and 720, respectively, are operably disposed upon and supported by the second supporting substrate 704.

At least one intra-device local transceiver is formed upon each of the first, second, third and fourth radio transceiver integrated circuit die 708-720 and is operable to support wireless communications with at least one other of the intra-device local transceivers formed upon the first, second, third and fourth radio transceiver integrated circuit die 708-720.

The first and second intra-device local transceivers are operable to wirelessly communicate with intra-device local transceivers utilizing a specified collision avoidance scheme. More specifically, in the embodiment of FIG. 19, the collision avoidance scheme comprises a carrier sense multiple access scheme wherein each of the first and second intra-device local transceivers is operable to transmit a request-to-send signal and does not transmit until it receives a clear-to-send response from the intended receiver. Thus, each local transceiver, in this embodiment, is operable to transmit a request-to-send signal to a specific local transceiver that is a target of a pending communication (the receiver of the communication) prior to initiating a data transmission or communication.

For example, the embodiment of FIG. 19 shows a first local transceiver 724 transmitting a request-to-send signal 728 to a second local transceiver 732. Additionally, each local transceiver is further operable to respond to a received request-to-send signal by transmitting a clear-to-send signal if there is no indication that a channel is in use. Thus, in the example of FIG. 19, local transceiver 732 generates a clear-to-send signal 736 to local transceiver 724.

As another aspect of the embodiment of FIG. 19, each local transceiver that receives the clear-to-send signal 736 is operable to set a timer to inhibit transmissions for a specified period. Thus, even though clear-to-send signal 736 was transmitted by local transceiver 732 to local transceiver 724, each local transceiver that detects clear-to-send signal 736 is operable to inhibit or delay future transmissions for a specified period.

In the example of FIG. 19, local transceiver 732 is further operable to broadcast the clear-to-send signal 736 to all local transceivers in range to reduce the likelihood of collisions. Thus, local transceiver 732 transmits (by way of associate substrate transceivers) the clear-to-send signal 736 to a local transceiver 740 that is also formed upon die 712.

As may also be seen, a local transceiver 744 is operable to detect clear-to-send signal 736 and to forward the clear-to-send signal 736 to each local transceiver on the same die 720 by way of local transceivers. In the example shown, local transceiver 744 sends clear-to-send signal 736 to a transceiver 748 by way of substrate transceivers within die 720.

In one embodiment, the request-to-send signal is only generated for data packets that exceed a specified size. As another aspect of the embodiments of the present invention, any local transceiver that detects a clear-to-send signal response sets a timer and delays any transmissions on the channel used to transmit the clear-to-send signal for a specified period. In yet another embodiment of the invention, a local transceiver merely listens for activity on a specified channel and transmits if no communications are detected.

The collision avoidance scheme in a different embodiment is a master/slave scheme similar to that used in personal area networks including Bluetooth™ protocol or standard devices. As such, a local transceiver is operable to control a communication as a master or to participate as directed in the role of a slave in the master/slave protocol communications. Further, the local transceiver is operable to operate as a master for one communication while operating as a slave in a different but concurrent communication.

Figure 20:
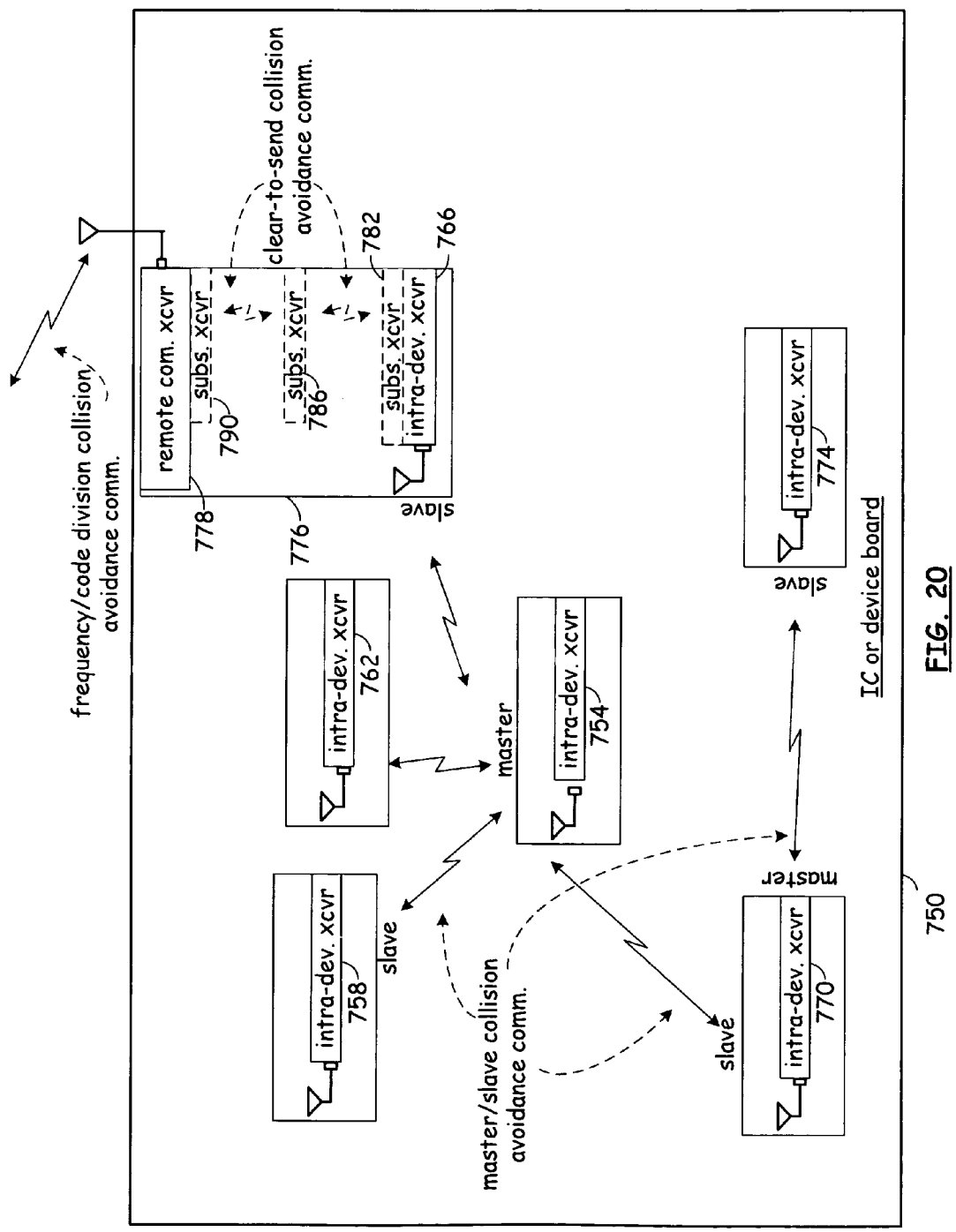
FIG. 20 is a functional block diagram of a substrate supporting a plurality of local transceivers operable according to one embodiment of the invention.

FIG. 20 is a functional block diagram of a substrate supporting a plurality of local transceivers operable according to one embodiment of the invention. A supporting board 750 is operable to support a plurality of integrated circuit radio transceivers. In the described embodiment, the transceivers are intra-device local transceivers that are operable to communicate with each other utilizing a very high radio frequency (at least 10 GHz). The supporting substrate may be any type of supporting board including a printed circuit board or even an integrated circuit that includes (supports) a plurality of local transceivers (intra-device transceivers). In the embodiment shown, the primary collision avoidance scheme is a master/slave implementation to control communications to avoid conflict and/or collisions. As may be seen, for the present operations, a local transceiver 754 (intra-device transceiver) is operable to control communications as a master for communications with transceivers 758, 762, 766 and 770. Transceiver 770, which is a slave for communications with transceiver 754, is a master for communications with transceiver 774.

While the primary collision avoidance scheme shown here in FIG. 20 is a master/slave scheme, it should be understood that a collision avoidance system as described in relation to FIG. 19 that includes the transmission of request-to-send and clear-to-send signals may also be implemented. In an embodiment of the invention in which the substrate is a board, such as a printed circuit board, the embodiment may further include a plurality of transceivers within an integrated circuit that is supported by the board. Thus, for example, if an integrated circuit 776 comprises an integrated circuit that includes intra-device transceiver 766 and a remote communication transceiver 778 in addition to a plurality of substrate transceivers 782, 786 and 790, a collision avoidance scheme is also implemented for communications within the integrated circuit 776, then either the same type of a different type of collision avoidance scheme may be implemented.

For example, a master/slave scheme is used for intra-device transceivers while a carrier sense scheme is used to avoid collisions within integrated circuit 776. Moreover, such schemes may be assigned for other communications including board-to-board (a local intra-device transceiver on a first board to a local intra-device transceiver on a second board). Moreover, any known collision avoidance scheme may also be used by remote communications transceiver 778 for remote communications (communications with remote devices). Use of carrier sense and master/slave schemes are particularly advantageous for communications that are not separated through frequency diversity (FDMA transmissions), space diversity (directional antennas), or even code diversity if a code division multiple access (CDMA) scheme is utilized to avoid collisions between intra-device local transceivers.

Figure 21:
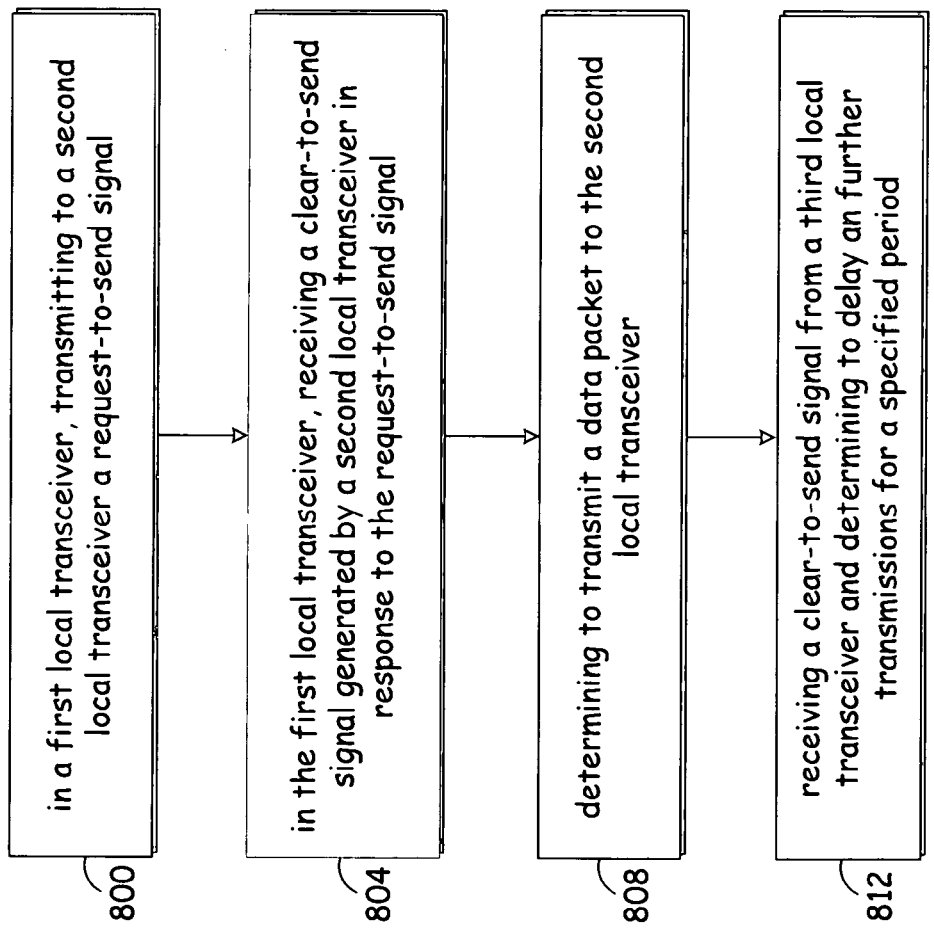
FIG. 21 illustrates a method for wireless local transmissions in a device according to one embodiment of the invention.

FIG. 21 illustrates a method for wireless local transmissions in a device according to one embodiment of the invention. The method includes, in a first local transceiver, transmitting to a second local transceiver a request-to-send signal (step 800). The method further includes, in the first local transceiver, receiving a clear-to-send signal generated by a second local transceiver in response to the request-to-send signal (step 804). After receiving the clear-to-send signal, the method includes determining to transmit a data packet to the second local transceiver (step 808) wherein the second local transceiver is operably disposed either within the integrated circuit or within a device housing the integrated circuit.

In one embodiment of the invention, the step of transmitting the request-to-send signal occurs only when the data packet to be transmitted exceeds a specified size. Finally, the method includes receiving a clear-to-send signal from a third local transceiver and determining to delay any further transmissions for a specified period (step 812). Generally, the method described in relation to FIG. 21 is a carrier sense scheme. Along these lines, variations to carrier sense schemes may be implemented. For example, in one alternate embodiment, a detection of a request-to-send type of signal may trigger a timer in each local transceiver that detects the request-to-send type of signal to delay transmissions to avoid a conflict. In yet another embodiment, a local transceiver merely initiates a communication if no other communications are detected on a specified communication channel.

Figure 22:
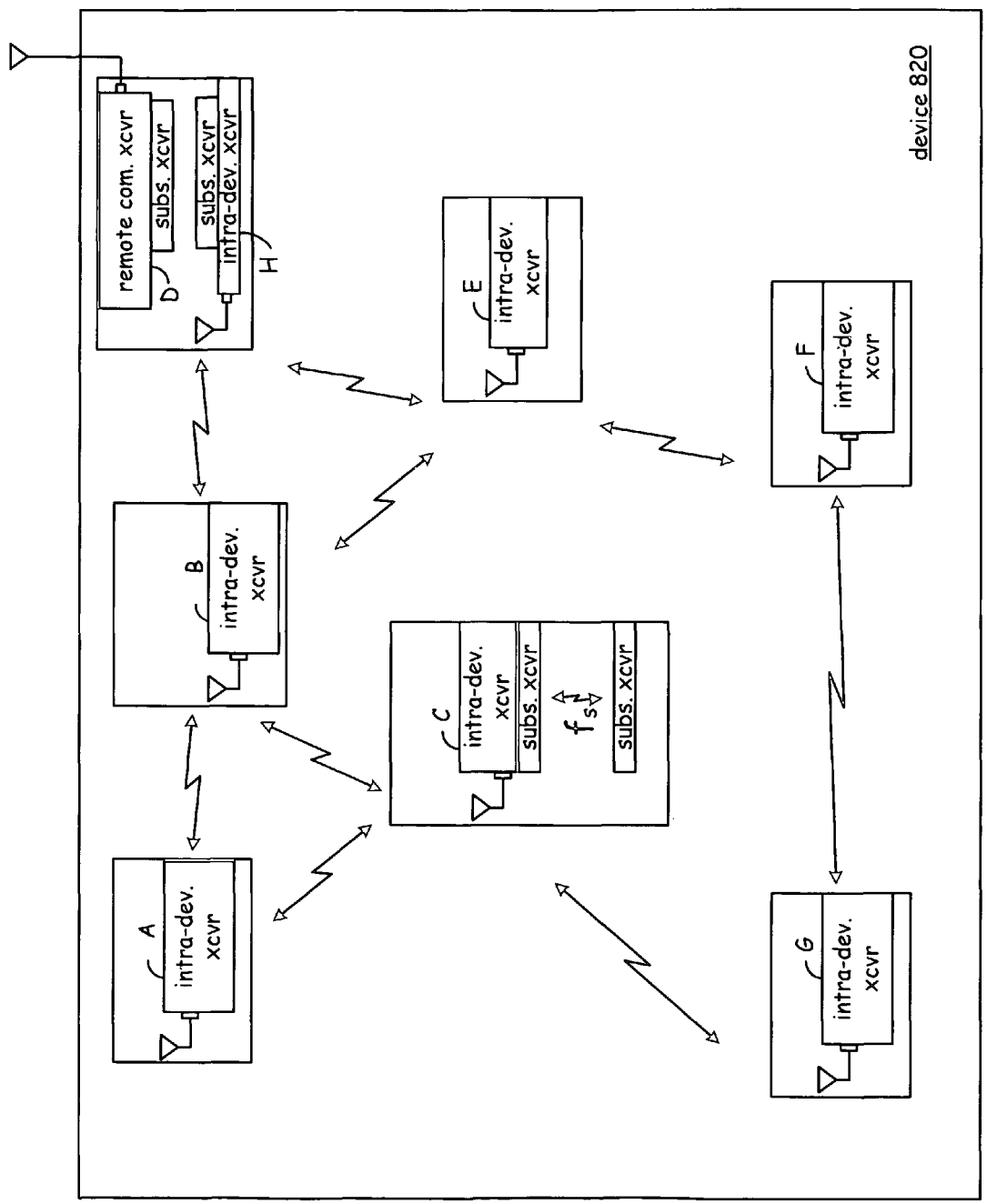
FIG. 22 is a functional block diagram a device that includes a mesh network formed within a board or integrated circuit according to one embodiment of the invention.

FIG. 22 is a functional block diagram a device that includes a mesh network formed within a board or integrated circuit according to one embodiment of the invention. Referring to FIG. 22, each of the local transceivers supported by a substrate 820 is operable as a node in a board level mesh network for routing communication signals from one local transceiver to another that is out of range for very short range transmissions at a very high radio frequency. More specifically, a network formed within a device that includes local transceivers A, B, C, D, E, F, G and H is operable to relay communications as a node based mesh network for defining multiple paths between any two local transceivers. In the embodiment shown, each of the local transceivers comprises a very high radio frequency transceiver for communications with local intra-device transceivers all within the same device. In one embodiment, the very high frequency local transceivers communicate at frequencies that equal at least 10 GHz. In one specific embodiment, the very high RF signal is a 60 GHz signal. The described embodiments of the invention include local transceivers that are operable to radiate electromagnetic signals at a low power to reduce interference with remote devices external to the device housing the board or integrated circuit (collectively "substrate") of FIG. 22.

The plurality of local transceivers of FIG. 22 operably form a mesh network of nodes that evaluate transceiver loading as well as communication link loading. Thus, each of the local transceivers A-H is operable to transmit, receive and process loading information to other local transceivers within the same device. Moreover, each is operable to make a next hop (transmit to a next intermediary node or local transceiver for forwarding towards the final destination node or local transceiver) and routing decisions based upon the loading information in relation to destination information (e.g., a final destination for a communication).

Figure 23:
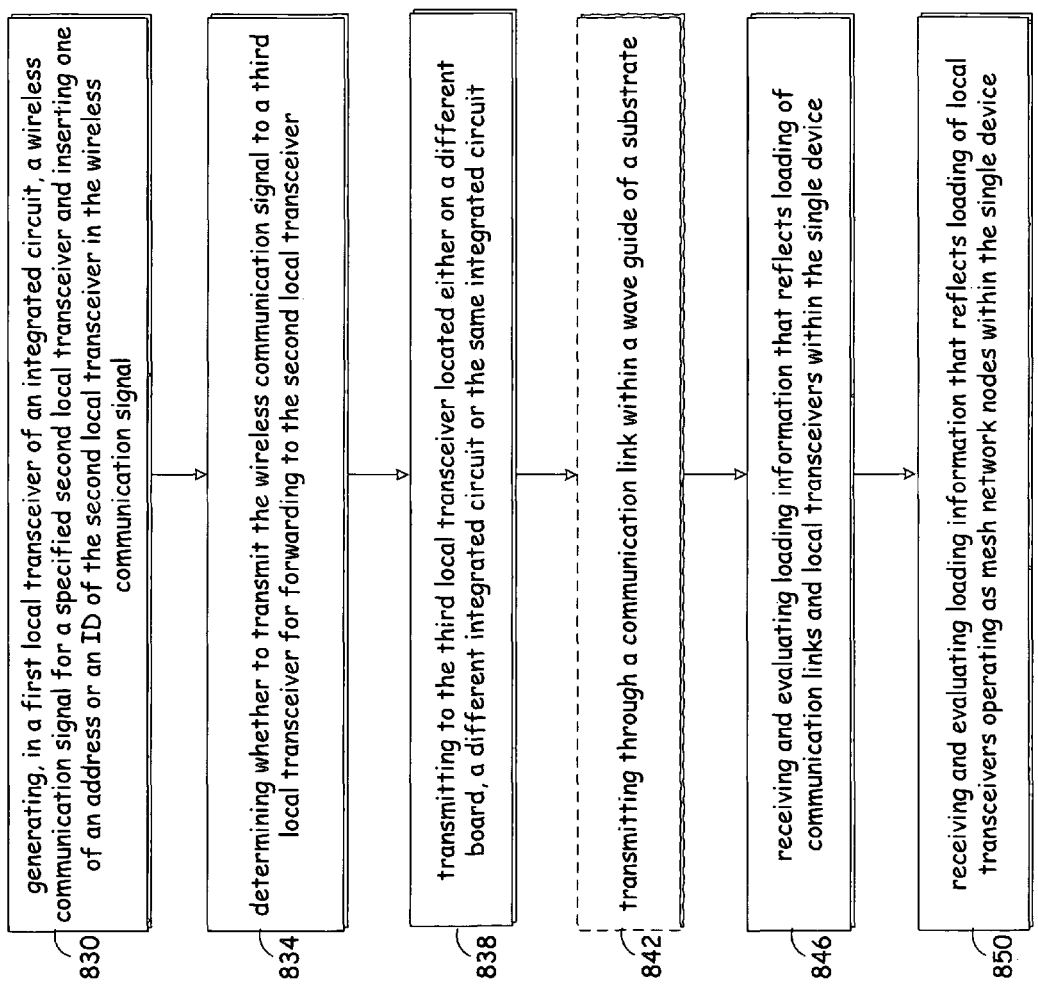
FIG. 23 is a flow chart illustrating a method according to one embodiment of the invention for routing and forwarding communications amongst local transceivers operating as nodes of a mesh network all within a single device.

FIG. 23 is a flow chart illustrating a method according to one embodiment of the invention for routing and forwarding communications amongst local transceivers operating as nodes of a mesh network all within a single device. The method includes initially generating, in a first local transceiver of an integrated circuit, a wireless communication signal for a specified second local transceiver and inserting one of an address or an ID of the second local transceiver in the wireless communication signal (step 830). As a part of transmitting the communication to the second transceiver, the method includes determining whether to transmit the wireless communication signal to a third local transceiver for forwarding the communication towards the second local transceiver either directly or to a fourth local transceiver for further forwarding (step 834). The next step thus includes sending the communication to the third local transceiver through a wireless communication link (step 838). The third local transceiver may be operably disposed (located) on a different board, a different integrated circuit on the same board, or even on the same integrated circuit. If on the same integrated circuit or board, the method optionally includes transmitting the communication within a wave guide formed within same integrated circuit or board or supporting substrate (step 842). The method further includes receiving loading information for loading of at least one communication link or at least one local transceiver (step 846). Thus, the method includes making routing and next hop determinations based upon the received loading information (step 850).

A given local transceiver of FIG. 22 is therefore operable to perform any combination or subset of the steps of FIG. 23 in addition to other steps to support operation as a node within a mesh network. More specifically, a first local transceiver is operable to forward communications as nodes in a mesh network wherein each node forms a communication link with at least one other node to forward communications. Communications received at the first local transceiver from a second local transceiver located on the same substrate may be forwarded to a third local transceiver located on the same substrate. The first local transceiver is further operable to establish a communication link with at least one local transceiver operably disposed on a separate substrate whether the separate substrate is a different integrated circuit operably disposed on the same board or a different integrated circuit operably disposed on a different board.

Each local transceiver, for example, the first and second local transceivers, is operable to select a downstream local transceiver for receiving a communication based upon loading. Loading is evaluated for at least one of an integrated circuit or a communication link. Each originating local transceiver is further operable to specify a final destination address for a communication and to make transmission decisions based upon the final destination address in addition to specifying a destination address for a next destination of a communication (the next hop) and to make transmission decisions based upon a final destination address. Finally, it should be noted that the mesh communication paths may be determined statically or dynamically. Thus, evaluating loading condition is one embodiment in which the routing is determined dynamically. In an alternate embodiment, however, communication routing may also be determined statically on a permanent basis.

Figure 24:
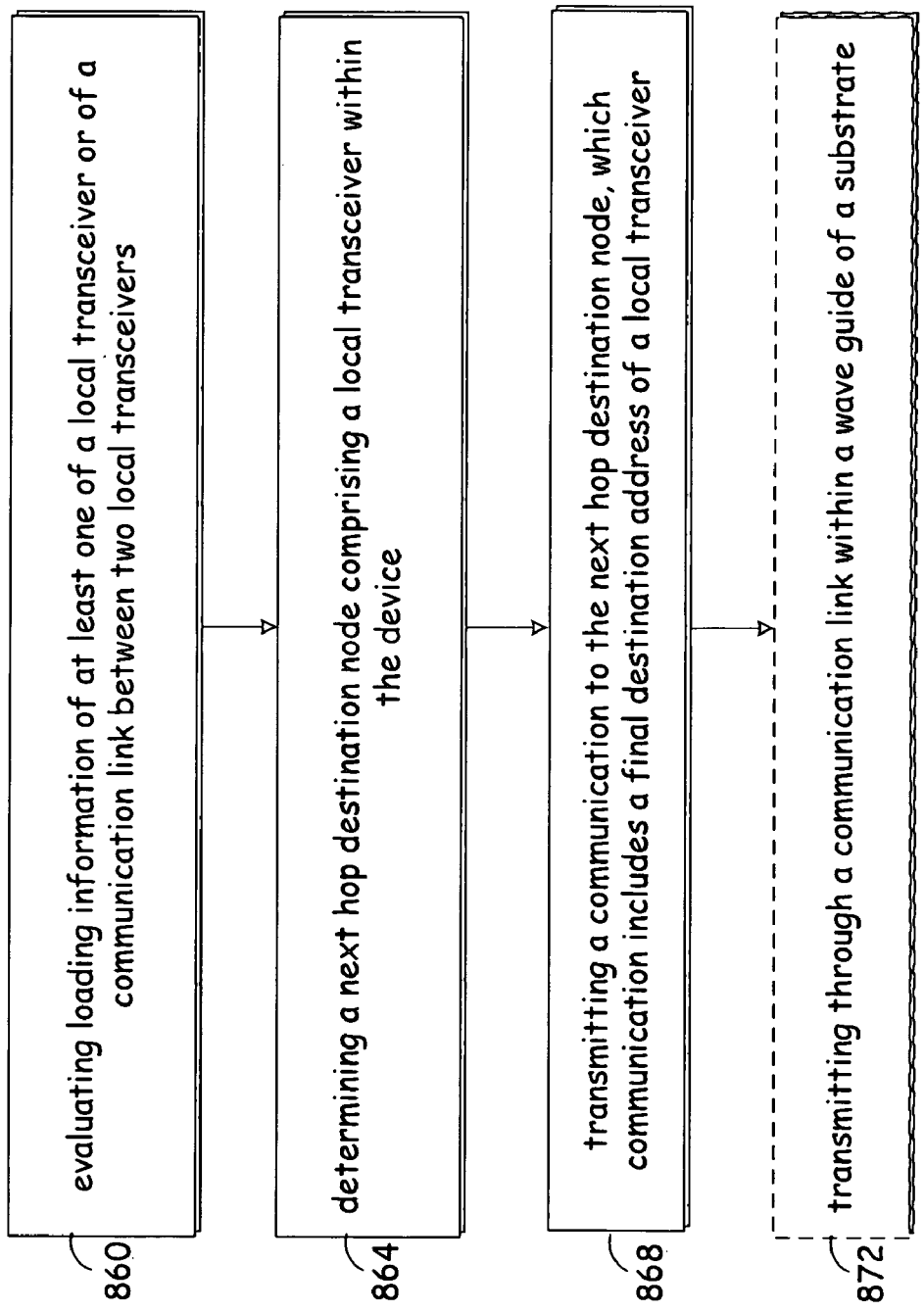
FIG. 24 illustrates a method for communications within a device according to one embodiment of the invention in which communications are transmitted through a mesh network within a single device.

FIG. 24 illustrates a method for communications within a device according to one embodiment of the invention in which communications are transmitted through a mesh network within a single device. The method includes evaluating loading information of at least one of a local transceiver or of a communication link between two local transceivers (step 860) and determining a next hop destination node comprising a local transceiver within the device (step 864). Thereafter, the method includes transmitting a communication to the next hop destination node, which communication includes a final destination address of a local transceiver (step 868). Generally, determining the next hop destination node is based upon loading information and upon the final destination of the communication. For a given route for a communication, communication links may result between local transceivers operably disposed on the same substrate, between local transceivers on the different integrated circuits operably disposed on the same substrate, between local transceivers on the different integrated circuits operably disposed on the same board, and between local transceivers on the different integrated circuits operably disposed on different substrates. A method optionally includes utilizing at least one communication link between local transceivers operably coupled by way of a wave guide formed within a substrate supporting the local transceivers (step 872).

Figure 25:
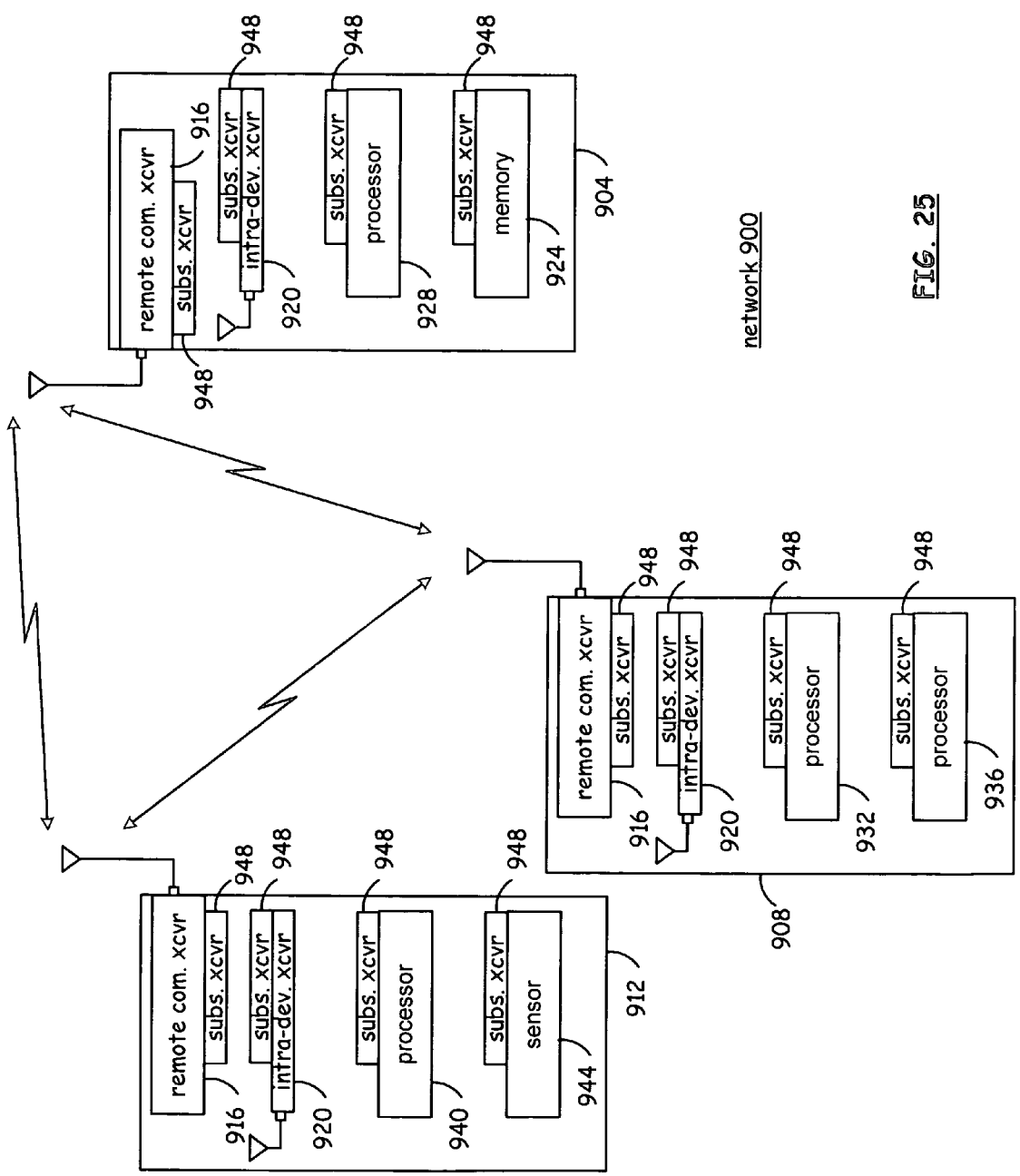
FIG. 25 is a functional block diagram of a network operating according to one embodiment of the present invention.

FIG. 25 is a functional block diagram of a network operating according to one embodiment of the present invention. A network 900 includes a plurality of devices 904, 908 and 912 that are operable to communicate using remote communication transceivers 916. These communications may be using any known communication protocol or standard including 802.11, Bluetooth, CDMA, GSM, TDMA, etc. The frequency for such communications may also be any known radio frequency for the specified communication protocol being used and specifically includes 900 MHz, 1800 MHz, 2.4 GHz, 60 GHz, etc.

Within each of the devices 904-912, intra-device local transceivers 920 communicate with each other at very high radio frequencies that are at least 10 GHz to provide access to a specific circuit module within the device. For example, intra-device local transceivers 920 may be utilized to provide access to memory 924 or processor 928 of device 904, to processors 932 and 936 of device 908, or to processor 940 and sensor 944 of device 912. Additionally, where available, access may also be provide through substrate communications using substrate transceivers 948. In the described embodiments, the substrate processors operate at very high radio frequencies of at least 10 GHz.

Within each device, the frequencies used may be statically or dynamically assigned as described herein this specification. Further, mesh networking concepts described herein this specification may be used to conduct communications through out a device to provide access to a specified circuit module. Additionally, the described collision avoidance techniques may be utilized including use of a clear-to-send approach or a master/slave approach to reduce interference and collisions.

As one application of all of the described embodiments, a tester may access any given circuit block or element using any combination of the remote communication transceivers 916, the intra-device local transceivers 920 or the substrate transceivers 948. As another application, such inter-device and intra-device communications may be used for resource sharing. Thus, for example, a large memory device may be placed in one location while a specialty application device and a computing device are placed in other locations. Such wireless communications thus support remote access to computing power of the computing device, to memory of the memory device or to the specific sensor of the specialty application device. While FIG. 25 illustrates distinct devices 904-912, it should be understood that some of these devices may also represent printed circuit boards or supporting boards housing a plurality of integrated circuit blocks that provide specified functions. For example a remote device 904 may communicate through the remote communication transceivers with two printed circuit boards 908 and 912 within a common device.

Figure 26:
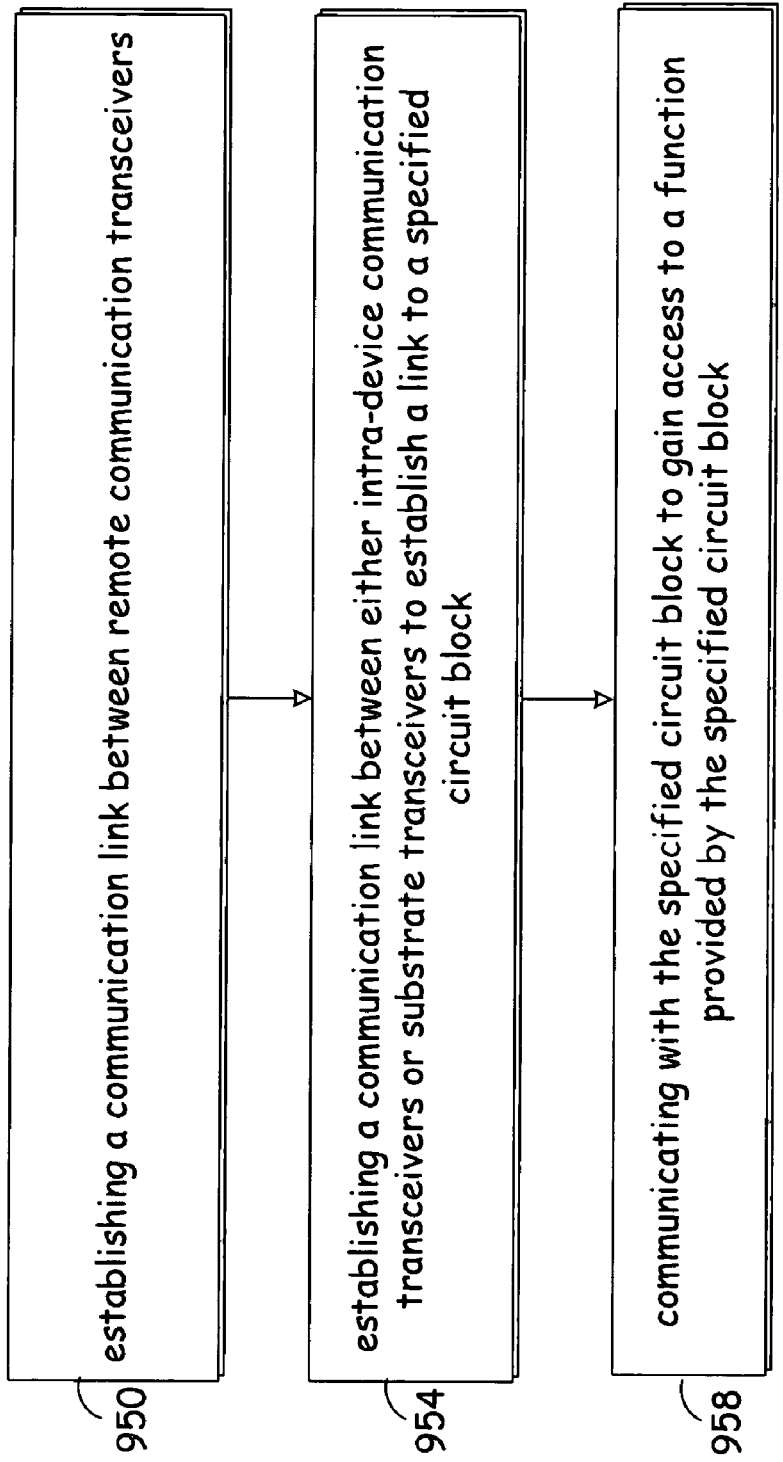
FIG. 26 is a flow chart illustrating a method according to one embodiment of the invention.

FIG. 26 is a flow chart illustrating the use of a plurality of wireless transceivers to provide access to a specified circuit block according to one embodiment of the invention. The method includes establishing a first communication link between remote communication transceivers (step 950), establishing a second communication link between either intra-device communication transceivers or substrate transceivers to establish a link to a specified circuit block (step 954), and communicating with the specified circuit block to gain access to a function provided by the specified circuit block (step 958). These steps include coupling the first and second communication links and, as necessary, translating communication protocols from a first to a second protocol and translating frequencies from a first frequency to a second frequency. As such, a remote device may access a specified circuit block to achieve the benefit of a function of the specified circuit block or to obtain data or to test one or more circuit blocks.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. Moreover, the various embodiments illustrated in the Figures may be partially combined to create embodiments not specifically described but considered to be part of the invention. For example, specific aspects of any one embodiment may be combined with another aspect of another embodiment or even with another embodiment in its entirety to create a new embodiment that is a part of the inventive concepts disclosed herein this specification. As may be seen, the described embodiments may be modified in many different ways without departing from the scope or teachings of the invention.

The invention claimed is:

1. A substrate within a device having a first and second intra-device local transceiver, the substrate comprising:
the first intra-device local transceiver formed upon the substrate;
a wave guide formed within the substrate operable to guide very high radio frequency (RF) signals within the wave guide;
a first substrate local transceiver operable to transmit the very high RF signals through the wave guide;
a second substrate local transceiver operable to receive the very high RF signals from the wave guide;
a first substrate antenna disposed within the wave guide and communicatively coupled to the first substrate local transceiver;
a second substrate antenna disposed within the wave guide and communicatively coupled to the second substrate local transceiver;
wherein the first and second substrate antennas are operably disposed to transmit and receive the very high RF signals through the wave guide;
wherein the first intra-device local transceiver is communicatively coupled to the first substrate local transceiver and is operable to wirelessly transmit low power RF signals through space to the second intra-device local transceiver; and
a remote transceiver communicatively coupled to at least one of the first substrate local transceiver, the second substrate local transceiver, the first intra-device local transceiver, or the second intra-device local transceiver, wherein the remote transceiver is operable to transmit wireless communication signals to remote wireless communication devices.

2. The substrate of claim 1 wherein the first intra-device local transceiver is operable to generate an RF transmission at a minimal power level sufficient to reach the second intra-device local transceiver operably disposed within the device.

3. The substrate of claim 2 wherein the first intra-device local transceiver generates a very high RF signal for transmission to the second intra-device local transceiver.

4. The substrate of claim 2 wherein the very high RF signal is at least 50 GHz.

5. The substrate of claim 4 wherein the circuitry for communicating with other intra-device local transceivers and for communicating with the first substrate local transceiver includes frequency conversion circuitry for converting from an RF signal characterized by a first RF frequency to an RF signal characterized by a second RF frequency wherein at least one of the first and second RF frequencies is a very high frequency signal that is at least 50 GHz.

6. The substrate of claim 1 wherein the substrate is one of a plurality of substrates operably disposed within a communication device and comprises at least one of an integrated circuit radio transceiver, a board supporting integrated circuit radio transceivers, or a printed circuit board supporting integrated circuit radio transceivers.

7. The substrate of claim 1 further including a second wave guide formed within a first integrated circuit die and a third substrate local transceiver operably disposed on the first integrated circuit die to communicate through the second wave guide.

8. The substrate of claim 7 wherein the first and second wave guides define substantially isolated signal paths in relation to each other to minimize co-interference.

9. The substrate of claim 8 wherein the first and second wave guides are physically diverse in relation to each other.

10. The substrate of claim 8 wherein a defined boundary is formed to operably isolate the first and second wave guides in relation to each other.

11. The substrate of claim 10 wherein one of the first and second wave guides is formed at least partially within the other of the first and second wave guides.

12. The substrate of claim 1 wherein the first integrated circuit die further includes:
   a first dielectric region further including electronic circuit components;
   a second dielectric region operable as the second wave guide for conducting very high radio frequency signals wherein the second dielectric region defines a bounded volume for conducting and substantially containing the very high radio frequency signals; and
   wherein the first and second substrate antennas are operably disposed to transmit and receive radio frequency communication signals through the second dielectric region.

13. The substrate of claim 12 wherein the second dielectric region comprises a substantially uniformly doped dielectric region.

14. The substrate of claim 13 wherein the second dielectric region comprises a plurality of wave guides.

15. An apparatus, comprising:
   first and second radio transceiver integrated circuit die;
   first and second very short range local transceivers formed within the first radio transceiver integrated circuit die having a substrate wave guide, wherein the first and second very short range local transceivers are operable to communicate with each other over a first frequency band characterized by very high radio frequency signals for intra-die communications;
   a first substrate antenna disposed within the substrate wave guide and communicatively coupled to the first very short range local transceiver;
   a second substrate antenna disposed within the substrate wave guide and communicatively coupled to the second very short range local transceiver, the first and second substrate antennas operably disposed to transmit and receive the very high radio frequency signals through the substrate wave guide;
   a first intra-device radio local transceiver operably coupled to the first radio transceiver integrated circuit die for supporting intra-device communications;
   a second intra-device radio local transceiver operably coupled to one of the first and second radio transceiver integrated circuit die wherein the first and second intra-device radio local transceivers are operable to communicate with each other using radio frequency signals characterized by a second frequency band; and
   a network device remote transceiver operably coupled to one of the first and second radio transceiver integrated circuit die wherein the network device remote transceiver is operable to communicate with remote network device transceivers using radio frequency signals characterized by a third frequency band.

16. The apparatus of claim 15 wherein the apparatus comprises a device with a plurality of boards supporting a plurality of radio transceiver integrated circuit die including the first and second radio transceiver integrated circuit die.

17. The apparatus of claim 15 wherein the device comprises a multi-chip module supporting the plurality of radio transceiver integrated circuit die including the first and second integrated circuit radio transceiver die.

18. The apparatus of claim 15 wherein the very high radio frequency signals are at least 50 GHz signals.

19. The apparatus of claim 18 further including:
   a supporting substrate including electronic circuit components;
   a guiding structure operable as the substrate wave guide and having a fabricated composition for guiding radio frequency electromagnetic waves wherein the guiding structure is formed within the supporting substrate;
   wherein the first and second substrate antennas are operably disposed to transmit and receive radio frequency communication signals through the guiding structure of the supporting substrate.

20. The apparatus of claim 18 wherein the first and second first very short range local transceivers generate very low power signals intended to only communicatively couple with very short range local transceivers operably disposed on the same die.

21. The apparatus of claim 18 wherein the apparatus supports intra-die RF communications utilizing very low power short range local communications, inter-die RF communications and inter-device for remote communications wherein the apparatus includes circuitry to couple at least one of the intra-die RF and inter-die RF communications to the inter-device communications with remote devices.

22. The apparatus of claim 18 wherein a center frequency of the very high radio frequency band is approximately equal to 60 GHz.

23. A method for communications within a device, comprising:
   generating a first radio frequency (RF) signal for reception by a local transceiver operably disposed within a same die that houses circuitry generating the first RF signal, the circuitry generating the first RF signal including a first substrate antenna disposed within a substrate wave guide communicatively coupling the first substrate antenna to a second substrate antenna coupled to the local transceiver;

generating a second RF signal for reception by a local transceiver operably disposed within a same device that houses circuitry for generating the second RF signal; and generating a third RF signal for reception by a remote transceiver external to the same device based upon one of the first and second RF signals.

24. The method of claim 23 wherein the first RF signal is a very high frequency signal characterized by a center channel frequency that is greater than or equal to 10 GHz.

25. The method of claim 23 further including transmitting the first RF signal at a power level intended for a local transceiver located within the same die as the circuitry transmitting the first RF signal.

26. The method of claim 25 wherein the first RF signal is transmitted through the substrate wave guide formed within a die housing the circuitry transmitting the first RF signal.

* * * * *

UNITED STATES PATENT AND TRADEMARK OFFICE
CERTIFICATE OF CORRECTION

PATENT NO. : 7,974,587 B2  Page 1 of 1
APPLICATION NO. : 11/648744
DATED : July 5, 2011
INVENTOR(S) : Ahmadreza Rofougaran It is certified that error appears in the above-identified patent and that said Letters Patent is hereby corrected as shown below:

Col. 28, line 42, in claim 20: before "very short range" delete "first"

Signed and Sealed this
Twenty-seventh Day of November, 2012

David J. Kappos
*Director of the United States Patent and Trademark Office*